(12) United States Patent
Manganelli et al.

(10) Patent No.: US 12,277,979 B2
(45) Date of Patent: Apr. 15, 2025

(54) NAND DATA PLACEMENT SCHEMA

(71) Applicant: Micron Technology, Inc., Boise, ID (US)

(72) Inventors: Carminantonio Manganelli, Benevento (IT); Paolo Papa, Naples (IT); Massimo Iaculo, San Marco Evangelista (IT); Giuseppe D'Eliseo, Caserta (IT); Alberto Sassara, Naples (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/527,978

(22) Filed: Dec. 4, 2023

(65) Prior Publication Data

US 2024/0112745 A1  Apr. 4, 2024

Related U.S. Application Data

(63) Continuation of application No. 18/075,027, filed on Dec. 5, 2022, now Pat. No. 11,955,189, which is a
(Continued)

(51) Int. Cl.
*G11C 16/34* (2006.01)
*G11C 16/10* (2006.01)
(Continued)

(52) U.S. Cl.
CPC ........ *G11C 16/3459* (2013.01); *G11C 16/102* (2013.01); *G11C 16/26* (2013.01);
(Continued)

(58) Field of Classification Search
CPC ... G11C 16/3459; G11C 16/102; G11C 16/26; G11C 29/42
See application file for complete search history.

(56) References Cited

U.S. PATENT DOCUMENTS 5,191,584 A    3/1993  Anderson
7,966,462 B2*  6/2011  Lee .................... G11C 16/0408
                                                711/103

(Continued)

FOREIGN PATENT DOCUMENTS

CN    1881471 A    12/2006
CN  101933095 A    12/2010
(Continued)

OTHER PUBLICATIONS

US 11,869,606 B2, 01/2024, Manganelli et al. (withdrawn)
(Continued)

*Primary Examiner* — Han Yang
(74) *Attorney, Agent, or Firm* — Schwegman Lundberg & Woessner, P.A.

(57) ABSTRACT

Disclosed in some examples are improvements to data placement architectures in NAND that provide additional data protection through an improved NAND data placement schema that allows for recovery from certain failure scenarios. The present disclosure stripes data diagonally across page lines and planes to enhance the data protection. Parity bits are stored in SLC blocks for extra protection until the block is finished writing and then the parity bits may be deleted.

20 Claims, 17 Drawing Sheets

Related U.S. Application Data continuation of application No. 16/488,681, filed as application No. PCT/US2019/022587 on Mar. 15, 2019, now Pat. No. 11,521,690.

(60) Provisional application No. 62/675,451, filed on May 23, 2018, provisional application No. 62/644,248, filed on Mar. 16, 2018.

(51) Int. Cl.
*G11C 16/26* (2006.01)
*G11C 29/42* (2006.01)
*H03K 19/02* (2006.01)
*H03K 19/21* (2006.01)

(52) U.S. Cl.
CPC ............ *G11C 29/42* (2013.01); *H03K 19/02* (2013.01); *H03K 19/21* (2013.01)

(56) References Cited

U.S. PATENT DOCUMENTS

| | | |
|---|---|---|
| 9,720,609 B1 | 8/2017 | Yan et al. |
| 10,101,942 B1 | 10/2018 | Parker et al. |
| 11,521,690 B2 | 12/2022 | Manganelli et al. |
| 11,635,894 B2 | 4/2023 | Papa et al. |
| 2001/0007119 A1 | 7/2001 | Katayama et al. |
| 2007/0079056 A1 | 4/2007 | Nakamura et al. |
| 2007/0143570 A1 | 6/2007 | Gorobets et al. |
| 2011/0138222 A1 | 6/2011 | Haines et al. |
| 2011/0228601 A1 | 9/2011 | Olbrich et al. |
| 2012/0317340 A1 | 12/2012 | So et al. |
| 2013/0166825 A1 | 6/2013 | Kim et al. |
| 2014/0040661 A1 | 2/2014 | Goel |
| 2014/0056070 A1 | 2/2014 | Tanzawa |
| 2014/0281813 A1 | 9/2014 | Wakchaure et al. |
| 2015/0143185 A1 | 5/2015 | Motwani |
| 2015/0220385 A1 | 8/2015 | Wood et al. |
| 2015/0347020 A1 | 12/2015 | Yano et al. |
| 2015/0349805 A1 | 12/2015 | Tsai et al. |
| 2015/0363266 A1 | 12/2015 | Hu et al. |
| 2016/0085625 A1 | 3/2016 | Amato et al. |
| 2017/0293527 A1 | 10/2017 | Shappir et al. |
| 2017/0315867 A1 | 11/2017 | Yang et al. |
| 2017/0315868 A1 | 11/2017 | Yang et al. |
| 2017/0315909 A1 | 11/2017 | Yang et al. |
| 2017/0317693 A1 | 11/2017 | Yang et al. |
| 2017/0323684 A1 | 11/2017 | Tailliet et al. |
| 2018/0046543 A1 | 2/2018 | Canepa et al. |
| 2018/0129430 A1 | 5/2018 | Kang et al. |
| 2018/0285195 A1* | 10/2018 | Yang .................. G06F 11/1068 |
| 2019/0065306 A1 | 2/2019 | Margetts |
| 2020/0043556 A1 | 2/2020 | Moon et al. |
| 2021/0335432 A1 | 10/2021 | Manganelli et al. |
| 2021/0357127 A1 | 11/2021 | Papa et al. |
| 2023/0100916 A1 | 3/2023 | Manganelli et al. |
| 2023/0367478 A1 | 11/2023 | Papa et al. |

FOREIGN PATENT DOCUMENTS

| | | |
|---|---|---|
| CN | 105279115 A | 1/2016 |
| CN | 106445724 | 2/2017 |
| CN | 107423158 A | 12/2017 |
| CN | 112074816 A | 12/2020 |
| CN | 112074908 A | 12/2020 |
| KR | 20120055725 A | 5/2012 |
| KR | 20170131797 A | 11/2017 |
| WO | WO-2019178538 A1 | 9/2019 |
| WO | WO-2019178545 A1 | 9/2019 |

OTHER PUBLICATIONS

"European Application Serial No. 19767519.2, Communication Pursuant to Article 94(3) EPC mailed Nov. 24, 2023", 5 pgs.
"Chinese Application Serial No. 201980029446.8, Office Action mailed Jan. 12, 2024", with English translation, 11 pages.
U.S. Appl. No. 16/488,681 U.S. Pat. No. 11,521,690, filed Aug. 26, 2019, NAND Data Placement.
U.S. Appl. No. 18/075,027, filed Dec. 5, 2022, NAND Data Placement Schema.
U.S. Appl. No. 16/488,696 U.S. Pat. No. 11,635,894 filed Aug. 26, 2019, Clustered Parity for NAND Data Placement Schema.
U.S. Appl. No. 18/137,820, filed Apr. 21, 2023, Clustered Parity for NAND Data Placement Schema.
"Chinese Application Serial No. 201980029379.X, Office Action mailed Sep. 28, 2023", with machine English translation, 12 pages.
"European Application Serial No. 19767519.2, Extended European Search Report mailed Sep. 23, 2021", 7 pgs.
"European Application Serial No. 19767519.2, Response filed Jul. 22, 2022 to Extended European Search Report mailed Sep. 23, 2021", 113 pgs.
"International Application Serial No. PCT/US2019/022576, International Preliminary Report on Patentability mailed Oct. 1, 2020", 7 pgs.
"International Application Serial No. PCT/US2019/022576, International Search Report mailed Jul. 2, 2019", 3 pgs.
"International Application Serial No. PCT/US2019/022576, Written Opinion mailed Jul. 2, 2019", 5 pgs.
"International Application Serial No. PCT/US2019/022587, International Preliminary Report on Patentability mailed Oct. 1, 2020", 8 pgs.
"International Application Serial No. PCT/US2019/022587, International Search Report mailed Jul. 2, 2019", 3 pgs.
"International Application Serial No. PCT/US2019/022587, Written Opinion mailed Jul. 2, 2019", 6 pgs.
"Korean Application Serial No. 10-2020-7029653, Notice of Preliminary Rejection mailed Mar. 30, 2022", W/English Translation, 8 pgs.
"Korean Application Serial No. 10-2020-7029653, Notice of Preliminary Rejection mailed Sep. 9, 2021", w/ English translation, 7 pgs.
"Korean Application Serial No. 10-2020-7029653, Response filed Jul. 28, 2022 to Notice of Preliminary Rejection mailed Mar. 30, 2022", with English claims, 19 pages.
Weingarten, Hanan, "Storage Controller Technologies for Next Generation Non-Volatile Memories", Flash Memory Summit 2016 Santa Clara, CA, [Online]. Retrieved from the Internet: <https://www.flashmemorysummit.com/English/Collaterals/Proceedings/2016/20160809_FB12_Weingarten.pdf>, (Aug. 9, 2016), 23 pages.
Weingarten,, Hanan, "NAND Flash PHY Units for Advanced SSD Design", Flash Memory Summit 2013 Santa Clara, CA, [Online]. Retrieved from the Internet: <https://www.flashmemorysummit.com/English/Collaterals/Proceedings/2013/20130813_B11_Weingarten.pdf>, (Aug. 13, 2013), 25 pages.

* cited by examiner

|  | PLANE 0 | PLANE 1 | ... | PLANE Y |
|---|---|---|---|---|
| PAGE LINE | BLOCK A | BLOCK B | ... | BLOCK X |
| 0 |  | CORRUPT | ... |  |
| 1 |  | CORRUPT | ... |  |
| 2 |  | CORRUPT | ... |  |
| 3 |  | CORRUPT | ... |  |
| 4 |  | CORRUPT | ... |  |
| 5 |  | CORRUPT | ... |  |
| 6 |  | CORRUPT | ... |  |
| ... |  | CORRUPT | ... |  |
| ... |  | CORRUPT | ... |  |
| ... |  | CORRUPT | ... |  |
| ... |  | CORRUPT | ... |  |
| ... |  | CORRUPT | ... |  |
| ... |  | CORRUPT | ... |  |
| ... |  | CORRUPT | ... |  |
| X-1 |  | CORRUPT | ... |  |
| X |  | FAIL HERE | ... |  |

*FIG. 5*

| PAGE LINE | PLANE 0<br>BLOCK A | PLANE 1<br>BLOCK B | ... | PLANE Y<br>BLOCK X |
|---|---|---|---|---|
| 0 | | | ... | |
| 1 | | | ... | |
| 2 | | | ... | |
| 3 | | | ... | |
| ... | | | ... | |
| Z-1 | | | ... | |
| Z | CORRUPT | CORRUPT | CORRUPT | CORRUPT |
| Z+1 | | | ... | |
| ... | | | ... | |
| ... | | | ... | |
| ... | | | ... | |
| ... | | | ... | |
| ... | | | ... | |
| ... | | | ... | |
| X-1 | | | ... | |
| X | APL HERE | APL HERE | APL HERE | APL HERE |

*FIG. 6*

| PAGE LINE | PLANE 0<br>BLOCK A | PLANE 1<br>BLOCK B | PLANE 2<br>BLOCK C | PLANE 3<br>BLOCK D |
|---|---|---|---|---|
| 0 | FIRST P1 | FIRST P2 | FIRST P3 | FIRST P4 |
| 1 | SECOND P4 | SECOND P1 | SECOND P2 | SECOND P3 |
| 2 | THIRD P3 | THIRD P4 | THIRD P1 | THIRD P2 |
| 3 | FOURTH P2 | FOURTH P3 | FOURTH P4 | FOURTH P1 |
| 4 | FIRST P5 | FIRST P6 | FIRST P7 | FIRST P8 |
| 5 | SECOND P8 | SECOND P5 | SECOND P6 | SECOND P7 |
| 6 | THIRD P7 | THIRD P8 | THIRD P5 | THIRD P6 |
| 7 | FOURTH P6 | FOURTH P7 | FOURTH P8 | FOURTH P5 |
| 8 | FIRST P9 | FIRST P10 | FIRST P11 | FIRST P12 |
| 9 | SECOND P12 | SECOND P9 | SECOND P10 | SECOND P11 |
| 10 | THIRD P11 | THIRD P12 | THIRD P9 | THIRD P10 |
| 11 | FOURTH P10 | FOURTH P11 | FOURTH P12 | FOURTH P9 |
| 12 | FIRST P13 | FIRST P14 | FIRST P15 | FIRST P16 |
| 13 | SECOND P16 | SECOND P13 | SECOND P14 | SECOND P15 |
| 14 | THIRD P15 | THIRD P16 | THIRD P13 | THIRD P14 |
| 15 | FOURTH P14 | FOURTH P15 | FOURTH P16 | FOURTH P13 |
| 16 | FIRST P17 | FIRST P18 | FIRST P19 | FIRST P20 |
| 17 | SECOND P20 | SECOND P17 | SECOND P18 | SECOND P19 |
| 18 | THIRD P19 | THIRD P20 | THIRD P17 | THIRD P18 |
| 19 | FOURTH P18 | FOURTH P19 | FOURTH P20 | FOURTH P17 |
| 20 | FIRST P21 | FIRST P22 | FIRST P23 | FIRST P24 |
| 21 | SECOND P24 | SECOND P21 | SECOND P22 | SECOND P23 |
| 22 | THIRD P23 | THIRD P24 | THIRD P21 | THIRD P22 |
| 23 | FOURTH P22 | FOURTH P23 | FOURTH P24 | FOURTH P21 |

*FIG. 7*

| PAGE LINE | PLANE 0<br>BLOCK A | PLANE 1<br>BLOCK B | PLANE 2<br>BLOCK C | PLANE 3<br>BLOCK D |
|---|---|---|---|---|
| 204 | FIRST P25 | FIRST P26 | FIRST P27 | FIRST P28 |
| 205 | SECOND P28 | SECOND P25 | SECOND P26 | SECOND P27 |
| 206 | THIRD P27 | THIRD P28 | THIRD P25 | THIRD P26 |
| 207 | FOURTH P26 | FOURTH P27 | FOURTH P28 | FOURTH P25 |
| 208 | FIRST P29 | FIRST P30 | FIRST P31 | FIRST P32 |
| 209 | SECOND P32 | SECOND P29 | SECOND P30 | SECOND P31 |
| 210 | THIRD P31 | THIRD P32 | THIRD P29 | THIRD P30 |
| 211 | FOURTH P30 | FOURTH P31 | FOURTH P32 | FOURTH P29 |
| 212 | FIRST P33 | FIRST P34 | FIRST P35 | FIRST P36 |
| 213 | SECOND P36 | SECOND P33 | SECOND P34 | SECOND P35 |
| 214 | THIRD P35 | THIRD P36 | THIRD P33 | THIRD P34 |
| 215 | FOURTH P34 | FOURTH P35 | FOURTH P36 | FOURTH P33 |

*FIG. 8*

| PARITY P1 | PARITY P2 | PARITY P3 | PARITY P4 | PARITY P5 | PARITY P6 | PARITY P7 | PARITY P8 | PARITY P9 | PARITY P10 | PARITY P11 | PARITY P12 |
|---|---|---|---|---|---|---|---|---|---|---|---|
| 902 | 904 | 906 | 908 | 910 | 912 | 914 | 916 | 918 | 920 | 922 | 924 |

TIME T0

| PARITY P13 | PARITY P14 | PARITY P15 | PARITY P16 | PARITY P17 | PARITY P18 | PARITY P19 | PARITY P20 | PARITY P21 | PARITY P22 | PARITY P23 | PARITY P24 |
|---|---|---|---|---|---|---|---|---|---|---|---|
| 926 | 928 | 930 | 932 | 934 | 936 | 938 | 940 | 942 | 944 | 946 | 948 |

TIME T1

| PARITY P25 | PARITY P26 | PARITY P27 | PARITY P28 | PARITY P29 | PARITY P30 | PARITY P31 | PARITY P32 | PARITY P33 | PARITY P34 | PARITY P35 | PARITY P36 |
|---|---|---|---|---|---|---|---|---|---|---|---|

TIME T2

FIG. 9

| PAGE LINE | PLANE 0<br>BLOCK A | PLANE 1<br>BLOCK B | PLANE 2<br>BLOCK C | PLANE 3<br>BLOCK D | TIME | FPC |
|---|---|---|---|---|---|---|
| 0 | PARITY 1 | PARITY 2 | PARITY 3 | PARITY 4 | | |
| 1 | PARITY 5 | PARITY 6 | PARITY 7 | PARITY 8 | T0 | 3 |
| 2 | PARITY 9 | PARITY 10 | PARITY 11 | PARITY 12 | | |
| 3 | PARITY 13 | PARITY 14 | PARITY 15 | PARITY 16 | | |
| 4 | PARITY 17 | PARITY 18 | PARITY 19 | PARITY 20 | T1 | 3 |
| 5 | PARITY 21 | PARITY 22 | PARITY 23 | PARITY 24 | | |
| ... | ... | ... | ... | ... | | |
| 51 | PARITY 205 | PARITY 206 | PARITY 207 | PARITY 208 | | |
| 52 | PARITY 209 | PARITY 210 | PARITY 211 | PARITY 212 | T17 | 3 |
| 53 | PARITY 213 | PARITY 214 | PARITY 215 | PARITY 216 | | |

*FIG. 10*

| PAGE LINE | PLANE 0 | PLANE 1 | ... | PLANE Y |
|---|---|---|---|---|
| 0 | | | ... | |
| 1 | | | ... | |
| 2 | | | ... | |
| 3 | | | ... | |
| ... | | | ... | |
| Z-1 | | | ... | |
| Z | | UECC | | |
| Z+1 | | UECC | ... | |
| ... | | UECC | ... | |
| ... | | UECC | ... | |
| ... | | UECC | ... | |
| ... | | UECC | ... | |
| ... | | | ... | |
| ... | | | ... | |
| ... | | | ... | |
| X-1 | | | ... | |
| X | | | | |

*FIG. 12*

| PAGE LINE | PLANE 0 | PLANE 1 | PLANE 2 | PLANE 3 | CLUSTER |
|---|---|---|---|---|---|
| 0 | PARITY 1 | PARITY 2 | PARITY 3 | PARITY 4 | 0 |
| 1 | PARITY 5 | PARITY 6 | PARITY 7 | PARITY 8 | |
| 2 | PARITY 9 | PARITY 10 | PARITY 11 | PARITY 12 | |
| 3 | PARITY 13 | PARITY 14 | PARITY 15 | PARITY 16 | |
| 4 | PARITY 17 | PARITY 18 | PARITY 19 | PARITY 20 | |
| 5 | PARITY 21 | PARITY 22 | PARITY 23 | PARITY 24 | |
| ... | ... | ... | ... | ... | |
| 51 | PARITY 205 | PARITY 206 | PARITY 207 | PARITY 208 | |
| 52 | PARITY 209 | PARITY 210 | PARITY 211 | PARITY 212 | |
| 53 | PARITY 213 | PARITY 214 | PARITY 215 | PARITY 216 | |
| 54 | PARITY 217 | PARITY 218 | PARITY 219 | PARITY 220 | 1 |
| 55 | PARITY 221 | PARITY 222 | PARITY 223 | PARITY 224 | |
| 56 | PARITY 225 | PARITY 226 | PARITY 227 | PARITY 228 | |
| ... | ... | ... | ... | ... | |
| 105 | PARITY 421 | PARITY 422 | PARITY 423 | PARITY 424 | |
| 106 | PARITY 425 | PARITY 426 | PARITY 427 | PARITY 428 | |
| 107 | PARITY 429 | PARITY 430 | PARITY 431 | PARITY 432 | |
| ... | ... | ... | ... | ... | |
| 810 | PARITY 3241 | PARITY 3242 | PARITY 3243 | PARITY 3244 | 15 |
| 811 | PARITY 3245 | PARITY 3246 | PARITY 3247 | PARITY 3248 | |
| 812 | ... | ... | ... | ... | |
| ... | ... | ... | ... | ... | |
| 856 | PARITY 3425 | PARITY 3426 | PARITY 3427 | PARITY 3428 | |
| 857 | PARITY 3429 | PARITY 3430 | PARITY 3431 | PARITY 3432 | |
| 858 | PARITY 3433 | PARITY 3434 | PARITY 3435 | PARITY 3436 | |

| PAGE LINE | PLANE 0 | PLANE 1 | PLANE 2 | PLANE 3 | TIME |
|---|---|---|---|---|---|
| 0 | PARITYX 1 | PARITYX 2 | PARITYX 3 | PARITYX 4 | T0 |
| 1 | PARITYX 5 | PARITYX 6 | PARITYX 7 | PARITYX 8 | T1 |
| 2 | PARITYX 9 | PARITYX 10 | PARITYX 11 | PARITYX 12 | |
| 3 | PARITYX 13 | PARITYX 14 | PARITYX 15 | PARITYX 16 | |
| 4 | PARITYX 17 | PARITYX 18 | PARITYX 19 | PARITYX 20 | ... |
| 5 | PARITYX 21 | PARITYX 22 | PARITYX 23 | PARITYX 24 | |
| ... | ... | ... | ... | ... | |
| 51 | PARITYX 205 | PARITYX 206 | PARITYX 207 | PARITYX 208 | |
| 52 | PARITYX 209 | PARITYX 210 | PARITYX 211 | PARITYX 212 | |
| 53 | PARITYX 213 | PARITYX 214 | PARITYX 215 | PARITYX 216 | T53 |

FIG. 14

NAND DATA PLACEMENT SCHEMA

PRIORITY APPLICATIONS

This application is a continuation of U.S. application Ser. No. 18/075,027, filed Dec. 5, 2022, which is a continuation of U.S. application Ser. No. 16/488,681, filed Aug. 26, 2019, now issued as U.S. Pat. No. 11,521,690, which is a U.S. National Stage Application under 35 U.S.C. 371 from International Application No. PCT/US2019/022587, filed Mar. 15, 2019, published as WO 2019/178545, which claims the benefit of priority to U.S. Provisional Application Ser. No. 62/675,451, filed May 23, 2018 and to U.S. Provisional Application Ser. No. 62/644,248, filed Mar. 16, 2018, all of which are incorporated herein by reference in their entireties.

BACKGROUND

Memory devices are typically provided as internal, semiconductor, integrated circuits in computers or other electronic devices. There are many different types of memory, including volatile and non-volatile memory.

Volatile memory requires power to maintain its data, and includes random-access memory (RAM), dynamic random-access memory (DRAM), or synchronous dynamic random-access memory (SDRAM), among others.

Non-volatile memory can retain stored data when not powered, and includes flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), magnetoresistive random-access memory (MRAM), or 3D XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption.

Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data.

However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to can refer to any memory cell that can store more than one bit of data per cell (i.e., that can represent more than two programmed states).

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) may extend adjacent a string of storage cells to form a channel for the storages cells of the string. In the example of a vertical string, the polysilicon structure may be in the form of a vertically extending pillar. In some examples the string may be "folded," and thus arranged relative to a U-shaped pillar. In other examples, multiple vertical structures may be stacked upon one another to form stacked arrays of storage cell strings.

Memory arrays or devices can be combined together to form a storage volume of a memory system, such as a solid-state drive (SSD), a Universal Flash Storage (UFS™) device, a MultiMediaCard (MMC) solid-state storage device, an embedded MMC device (eMMC™), etc. An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.).

SSDs use non-volatile memory cells, such as flash memory cells to obviate internal battery supply requirements, thus allowing the drive to be more versatile and compact.

An SSD can include a number of memory devices, including a number of dies or logical units (e.g., logical unit numbers or LUNs), and can include one or more processors or other controllers performing logic functions required to operate the memory devices or interface with external systems. Such SSDs may include one or more flash memory die, including a number of memory arrays and peripheral circuitry thereon. The flash memory arrays can include a number of blocks of memory cells organized into a number of physical pages. In many examples, the SSDs will also include DRAM or SRAM (or other forms of memory die or other memory structures). The SSD can receive commands from a host in association with memory operations, such as read or write operations to transfer data (e.g., user data and associated integrity data, such as error data and address data, etc.) between the memory devices and the host, or erase operations to erase data from the memory devices.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 5 illustrates possible effects of a programming failure of a NAND.

FIG. 6 illustrates possible effects an asynchronous power loss during programming of a NAND.

FIGS. 7 and 8 illustrate an improved NAND data placement schema of data on a TLC NAND array according to some examples of the present disclosure.

FIG. 9 illustrates a logical placement of the parity pages in a volatile memory of the controller or other component of the NAND according to some examples of the present disclosure.

FIG. 10 illustrates a schematic of a parity value storage used to store the parity pages in nonvolatile NAND.

FIG. 12 illustrates an example of an uncorrectable error of a NAND according to some examples of the present disclosure.

FIG. 13 illustrates storage of a plurality of parity values that are arranged in a plurality of clusters according to some examples of the present disclosure.

FIG. 14 illustrates storage of a plurality of compressed parity values according to some examples of the present disclosure.

DETAILED DESCRIPTION

Disclosed in some examples are methods of organizing data written to a memory device (such as a NAND memory device) in order to protect against certain types of faults. For example, a first portion is programmed on a first page line and a first plane, a second portion is programmed on a second page line and a second plane, a third portion is programmed on a third page line and a third plane, and a fourth portion is programmed on a fourth page line and a fourth plane. The first page line, second page line, third page line, first plane, second plane, and third plane are selected such that the first portion, second portion and third portion are stored in memory cells that are on different page lines and different planes with respect to each other.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile random-access memory (RAM) memory device, such as dynamic RAM (DRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, etc.). In certain examples, electronic devices can include a user interface (e.g., a display, touchscreen, keyboard, one or more buttons, etc.), a graphics processing unit (GPU), a power management circuit, a baseband processor or one or more transceiver circuits, etc.

Figure 1:
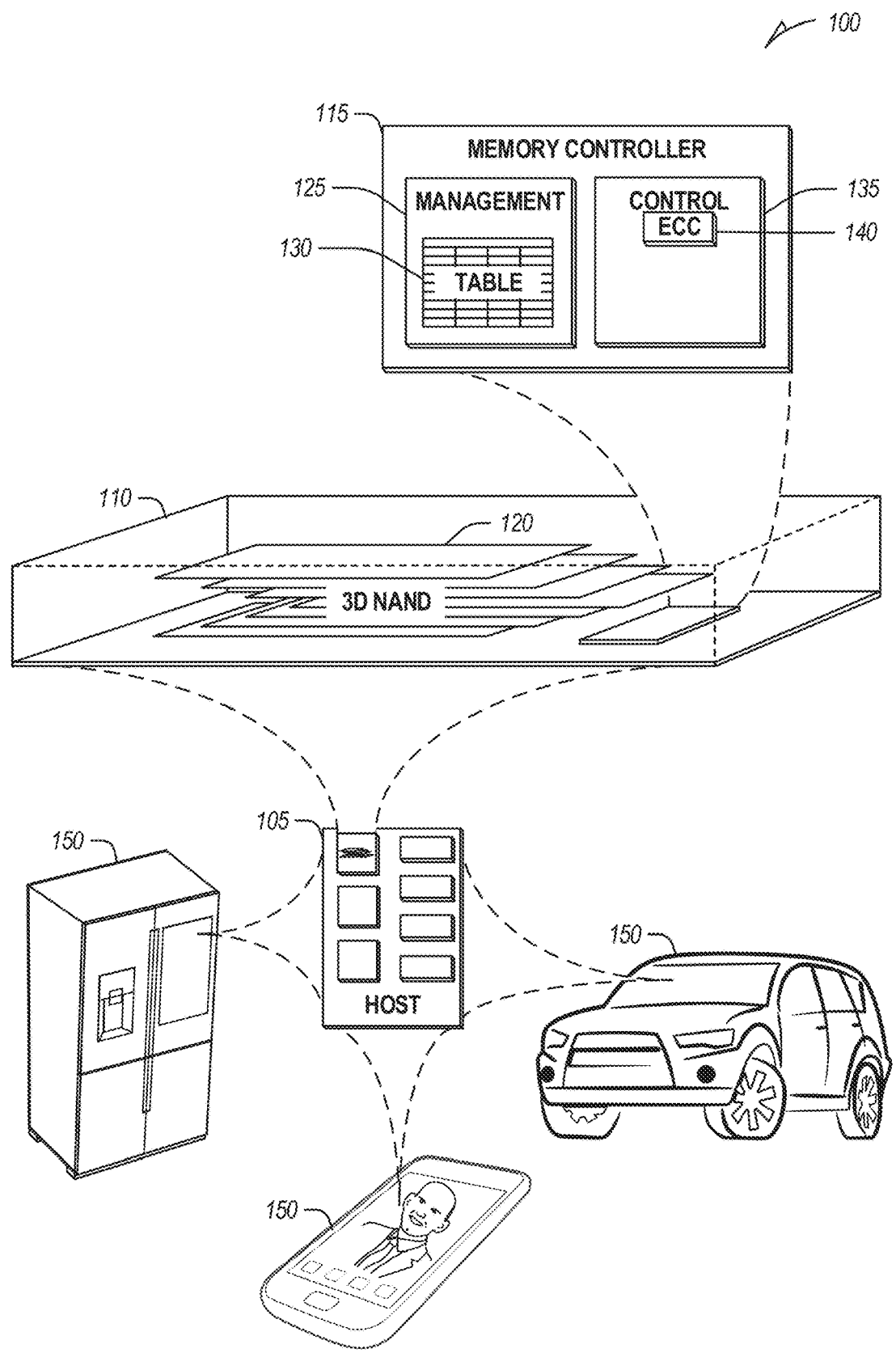
FIG. 1 illustrates an example of an environment including a memory device.

FIG. 1 illustrates an example of an environment 100 including a host device 105 and a memory device 110 configured to communicate over a communication interface. The host device 105 or the memory device 110 may be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory controller 115 and a memory array 120 including, for example, a number of individual memory die (e.g., a stack of three-dimensional (3D) NAND die). In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105.

One or more communication interfaces can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system, an electronic device, a processor, a memory card reader, or one or more other electronic devices external to the memory device 110. In some examples, the host 105 may be a machine having some portion, or all, of the components discussed in reference to the machine 1700 of FIG. 17.

The memory controller 115 can receive instructions from the host 105, and can communicate with the memory array, such as to transfer data to (e.g., write or erase) or from (e.g., read) one or more of the memory cells, planes, sub-blocks, blocks, or pages of the memory array. The memory controller 115 can include, among other things, circuitry or firmware, including one or more components or integrated circuits. For example, the memory controller 115 can include one or more memory control units, circuits, or components configured to control access across the memory array 120 and to provide a translation layer between the host 105 and the memory device 110. The memory controller 115 can include one or more input/output (I/O) circuits, lines, or interfaces to transfer data to or from the memory array 120. The memory controller 115 can include a memory manager 125 and an array controller 135.

The memory manager 125 can include, among other things, circuitry or firmware, such as a number of components or integrated circuits associated with various memory management functions. For purposes of the present description example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data, while maintaining integrity of the data transferred between the host 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors.

In some examples, the memory array may comprise a number of NAND dies and one or more functions of the memory controller 115 for a particular NAND die may be implemented on an on-die controller on that particular die. Other organizations and delineations of control functionality may also be utilized, such as a controller for each die, plane, superblock, block, page, and the like.

The memory array 120 can include several memory cells arranged in, for example, a number of devices, semi-conductor dies, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, may be selectively operated in SLC mode, or in a desired MLC mode (such as TLC, QLC, etc.).

In operation, data is typically written to or read from the NAND memory device 110 in pages, and erased in blocks. However, one or more memory operations (e.g., read, write, erase, etc.) can be performed on larger or smaller groups of memory cells, as desired. The data transfer size of a NAND memory device 110 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a multi-level cell (MLC) NAND flash device may have a higher bit error rate than a corresponding single-level cell (SLC) NAND flash device. As such, the MLC device may require more metadata bytes for error data than the corresponding SLC device.

Figure 2:
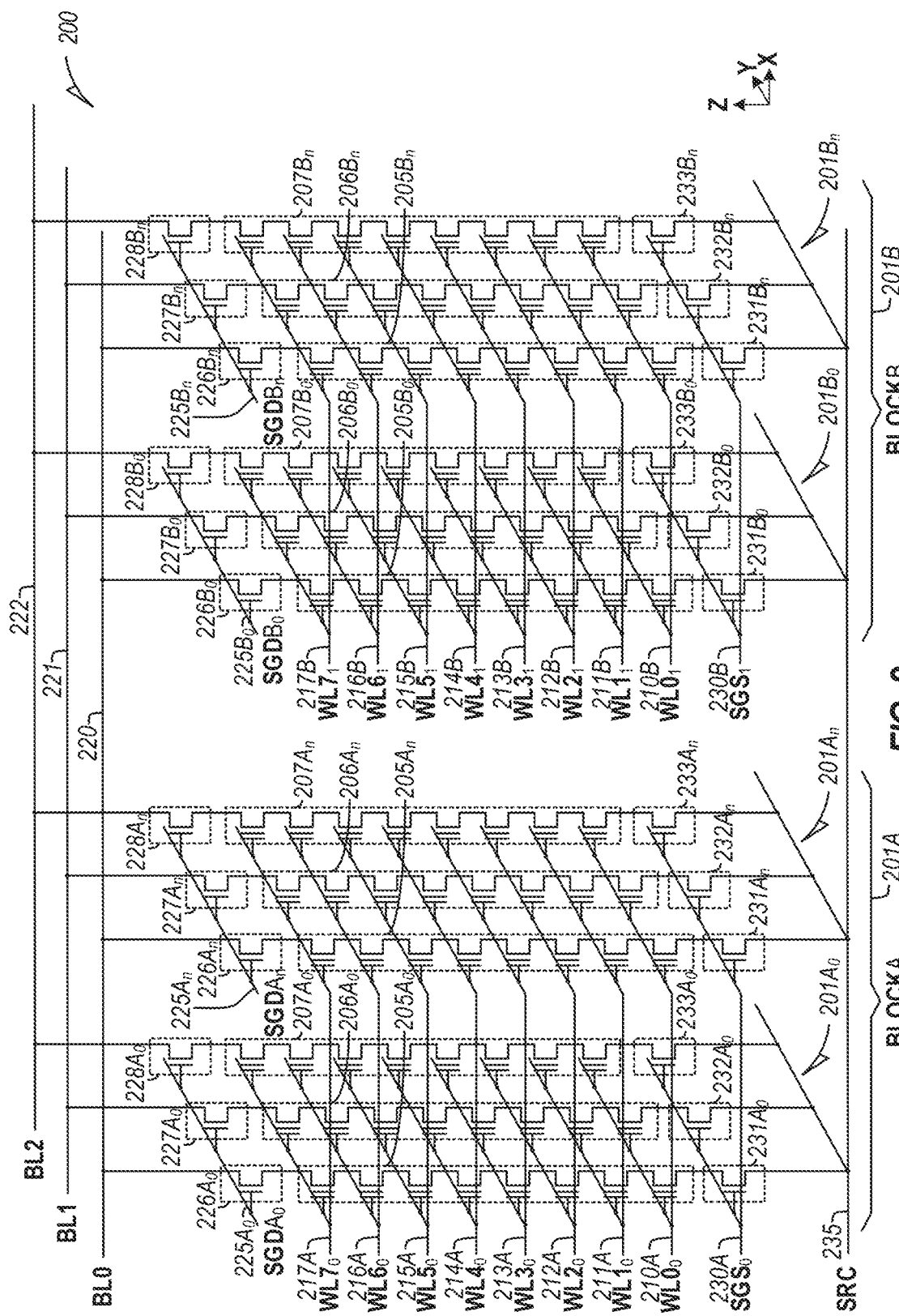
FIGS. 2-3 illustrate schematic diagrams of an example of a 3D NAND architecture semiconductor memory array.

FIG. 2 illustrates an example schematic diagram of a 3D NAND architecture semiconductor memory array 200 including a number of strings of memory cells (e.g., first-third $A_0$ memory strings $205A_0$-$207A_0$, first-third $A_n$ memory strings $205A_n$-$207A_n$, first-third $B_0$ memory strings $205B_0$-$207B_0$, first-third $B_n$ memory strings $205B_n$-$207B_n$, etc.), organized in blocks (e.g., block A 201A, block B 201B, etc.) and sub-blocks (e.g., sub-block $A_0$ $201A_0$, sub-block $A_n$ $201A_n$, sub-block $B_0$ $201B_0$, sub-block $B_n$ $201B_n$, etc.). The memory array 200 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS $231A_0$-$233A_0$, first-third $A_n$ SGS $231A_n$-$233A_n$, first-third $B_0$ SGS $231B_0$-$233B_0$, first-third $B_n$ SGS $231B_n$-$233B_n$, etc.) and a drain-side select gate (SGD) (e.g., first-third $A_0$ SGD $226A_0$-$228A_0$, first-third $A_n$ SGD $226A_n$-$228A_n$, first-third $B_0$ SGD $226B_0$-$228B_0$, first-third $B_n$ SGD $226B_n$-$228B_n$, etc.). Each string of memory cells in the 3D memory array can be arranged along the X direction as data lines (e.g., bit lines (BL) BL0-BL2 220-222), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 200 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate (CG) coupled to (e.g., electrically or otherwise operatively connected to) an access line (e.g., word lines (WL) $WL0_0$-$WL7_0$ 210A-217A, $WL0_1$-$WL7_1$ 210B-217B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD $226A_0$-$228A_0$ can be accessed using an $A_0$ SGD line $SGDA_0$ $225A_0$, first-third $A_n$ SGD $226A_n$-$228A_n$ can be accessed using an $A_n$ SGD line $SGDA_n$ $225A_n$, first-third $B_0$ SGD $226B_0$-$228B_0$ can be accessed using an $B_0$ SGD line $SGDB_0$ $225B_0$, and first-third $B_n$ SGD $226B_n$-$228B_n$ can be accessed using an $B_n$ SGD line $SGDB_n$ $225B_n$. First-third $A_0$ SGS $231A_0$-$233A_0$ and first-third $A_n$ SGS $231A_n$-$233A_n$ can be accessed using a gate select line $SGS_0$ 230A, and first-third $B_0$ SGS $231B_0$-$233B_0$ and first-third $B_n$ SGS $231B_n$-$233B_n$ can be accessed using a gate select line $SGS_1$ 230B.

In an example, the memory array 200 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 3:
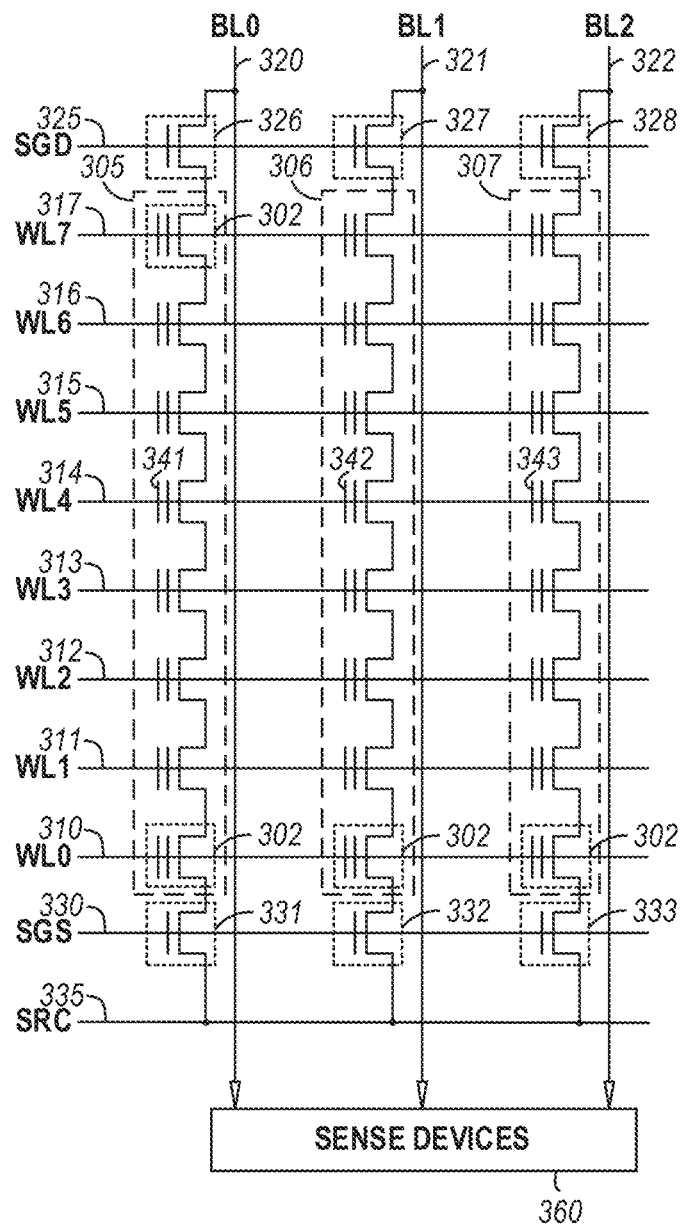

FIG. 3 illustrates an example schematic diagram of a portion of a NAND architecture semiconductor memory array 300 including a plurality of memory cells 302 arranged in a two-dimensional array of strings (e.g., first-third strings 305-307) and tiers (e.g., illustrated as respective word lines (WL) WL0-WL7 310-317, a drain-side select gate (SGD) line 325, a source-side select gate (SGS) line 330, etc.), and sense amplifiers or devices 360. For example, the memory array 300 can illustrate an example schematic diagram of a portion of one physical page of memory cells of a 3D NAND architecture semiconductor memory device, such as illustrated in FIG. 2.

Each string of memory cells is coupled to a source line (SRC) using a respective source-side select gate (SGS) (e.g., first-third SGS 331-333), and to a respective data line (e.g., first-third bit lines (BL) BL0-BL2 320-322) using a respective drain-side select gate (SGD) (e.g., first-third SGD 326-328). Although illustrated with 8 tiers (e.g., using word lines (WL) WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control gates (CGs) 341-343 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 360, coupled to one or more of the data lines (e.g., first, second, or third bit lines (BL0-BL2) 320-322), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 4:
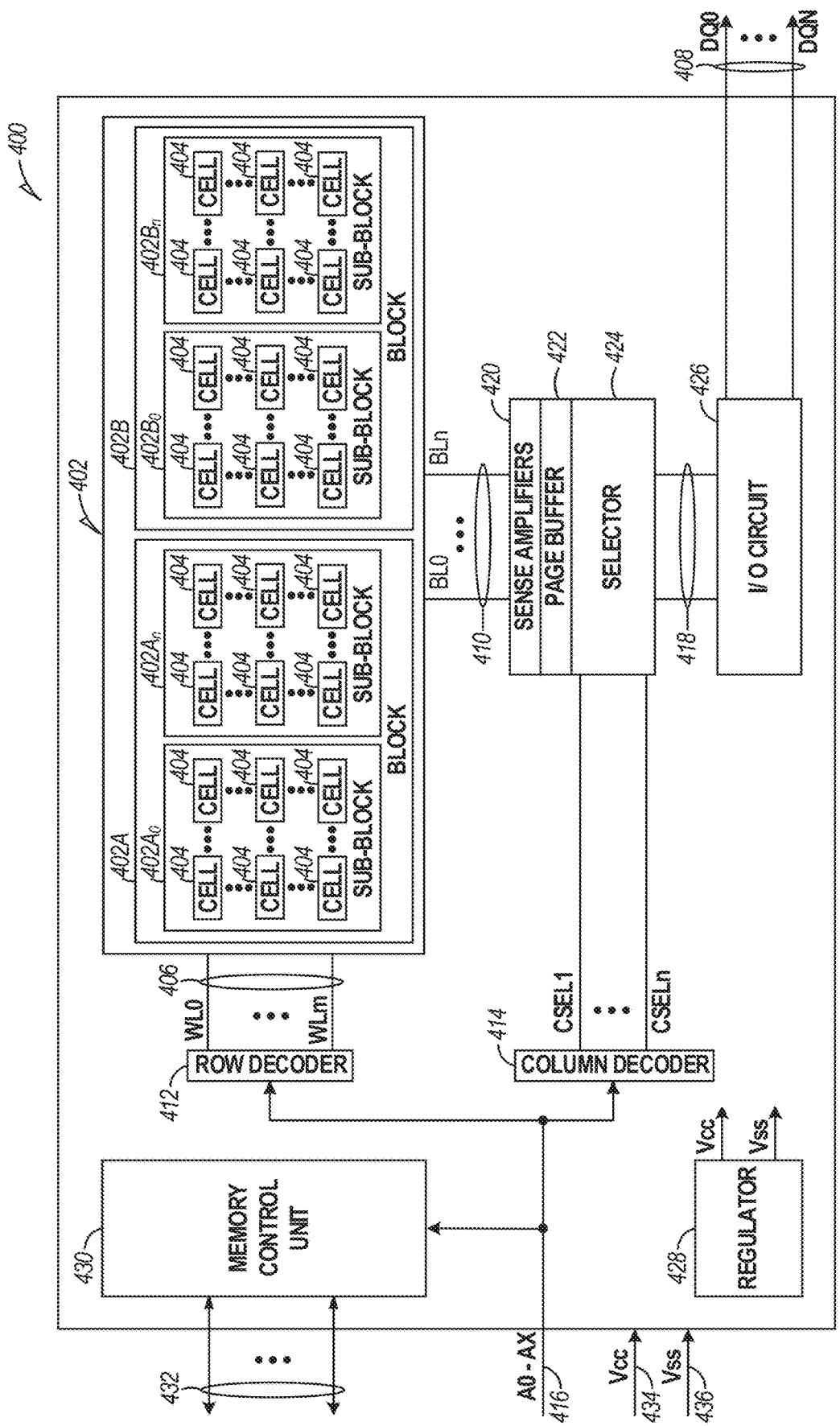
FIG. 4 illustrates an example block diagram of a memory module.

FIG. 4 illustrates an example block diagram of a memory device 400 including a memory array 402 having a plurality of memory cells 404, and one or more circuits or components to provide communication with, or perform one or more memory operations on, the memory array 402. The memory device 400 can include a row decoder 412, a column decoder 414, sense amplifiers 420, a page buffer 422, a selector 424, an input/output (I/O) circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks $402A_0$, $402A_n$, and the second block 402B can include first and second sub-blocks $402B_0$, $402B_n$. Each sub-block can include a number of physical pages, each page including a number of memory cells 404. Although illustrated herein as having two blocks, each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory device 400 according to one or more signals or instructions received on control lines 432, including, for example, one or more clock signals or control signals that indicate a desired operation (e.g., write, read, erase, etc.), or address signals (A0-AX) received on one or more address lines 416. One or more devices external to the memory device 400 can control the values of the control signals on the control lines 432, or the address signals on the address line 416. Examples of devices external to the memory device 400 can include, but are not limited to, a host, a memory controller, a processor, or one or more circuits or components not illustrated in FIG. 4.

The memory device 400 can use access lines 406 and first data lines 410 to transfer data to (e.g., write or erase) or from (e.g., read) one or more of the memory cells 404. The row decoder 412 and the column decoder 414 can receive and decode the address signals (A0-AX) from the address line 416, can determine which of the memory cells 404 are to be accessed, and can provide signals to one or more of the access lines 406 (e.g., one or more of a plurality of word lines (WL0-WLm)) or the first data lines 410 (e.g., one or more of a plurality of bit lines (BL0-BLn)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory device 400 can communicate with the memory device 400 using the I/O lines (DQ0-DQN) 408, address lines 416 (A0-AX), or control lines 432. The input/output (I/O) circuit 426 can transfer values of data in or out of the memory device 400, such as in or out of the page buffer 422 or the memory array 402, using the I/O lines 408, according to, for example, the control lines 432 and address lines 416. The page buffer 422 can store data received from the one or more devices external to the memory device 400 before the data is programmed into relevant portions of the memory array 402, or can store data read from the memory array 402 before the data is transmitted to the one or more devices external to the memory device 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418.

The memory control unit 430 can receive positive and negative supply signals, such as a supply voltage (Vcc) 434 and a negative supply (Vss) 436 (e.g., a ground potential), from an external source or supply (e.g., an internal or external battery, an AC-to-DC converter, etc.). In certain examples, the memory control unit 430 can include a regulator 428 to internally provide positive or negative supply signals.

ECC and other techniques have increased the reliability of NAND devices substantially. Nonetheless, there are certain circumstances in which additional protection against data loss is desired. For example, as shown in FIG. 5, a write operation that has a programming failure while programming page line X, 510, may corrupt many pages inside that plane. As shown in FIG. 5, all pages in the plane (e.g., plane 1) have been corrupted by the programming failure of page line X, 510. Similarly, and as shown in FIG. 6, an asynchronous power loss (loss of power to the NAND device without warning) during programming of a first page line X, 607 may also corrupt a different page line Z, 605.

As used herein, a page line is a logical construct that identifies a group of pages comprising pages at a same position in each plane in a group of planes. Thus, for example, the first page in planes 0-3 is identified by page line 0. A page is made up of memory cells belonging to the same word line. A block is a group of pages—i.e., all NAND strings that share the same group of word lines (a NAND string is a group of NAND cells connected in series). In some NAND configurations, a block is a smallest erasable unit. A page is a smallest addressable unit for reading and writing. A plane is a group of physical blocks on a single NAND die, configured for operation such that physical blocks from each of multiple planes can be erased in parallel (i.e., during a given time interval the physical blocks can be erased essentially simultaneously, or in overlap with one another), but only a single physical block in any individual plane can be erased at any one time. There may be multiple planes per NAND die. As shown in FIGS. 5-8, 10, and 12-14 a plane is represented by a single physical block (chosen from the list of physical blocks of that plane)—so for example, in FIG. 5, the plane depicts the list of pages in that selected physical block, but there are additional physical blocks not shown for purposes of clarity.

Disclosed in some examples are improvements to NAND devices that provide additional data protection through an improved NAND data placement schema that allows for recovery from the failure scenarios described in FIG. 5 and FIG. 6. The present disclosure stripes data portions across page lines and planes to ensure that a power failure or programming error affecting an entire page line or plane does not corrupt the entire data item and at most corrupts a single portion of the data item. In some examples, parity information may be calculated and stored until the programming is finished. This parity information may be utilized to recover from corruption of a portion of the data item.

For example, the NAND may receive a data item from a host device. This data item may be split into a number of portions. For purposes of the present description, example will be utilized in which a receive data item is split into four portions. As will be readily apparent to persons skilled in the art having the benefit of this disclosure, receive data items may be split into fewer or a greater number of portions. A first portion may be programmed at a first location in the NAND, a second portion at a second location, a third portion at a third location, and a fourth portion at a fourth location. The first location, second location, third location, and fourth location may be selected such that the first portion, second portion, third portion, and fourth portion are stored in memory cells that are on different page lines and different planes with respect to each other. Different locations for the first, second, third, and fourth portions may include different planes, pages, dies, blocks, and the like. In some examples, the first, second, third, and fourth portions may be stored on a same die. The first, second, third, and fourth portions may be coupled in various relations to one or more other portions. For example, in some examples, the first and second portions may be stored adjacent to each other in terms of being stored in adjacent page lines and adjacent planes (e.g., as shown in FIG. 7). As used herein, adjacent means a next page line and/or plane in sequence. In some examples, the second and third portions may be stored adjacent to each other in terms of being stored in adjacent page lines and adjacent planes. In some examples, the third and fourth portions may be stored adjacent to each other in terms of being stored in adjacent page lines and adjacent planes. See for example, FIGS. 1, 710, 715, 720, and 725 (discussed in more detail below). The portions of data are thus stored so that corruption on a single plane or a single word line does not corrupt more than a single portion of the data. This enables the NAND to reconstruct the corrupted portion using the parity data. In some examples, each of the first, second, and third portions may be, respectively, a lower page, an extra page, and an upper page relative to one another. In these examples, the fourth portion may be a copy of one of the first, second, and third portions.

FIGS. 7 and 8 show an improved NAND data placement schema of data on a TLC NAND array 700 with four planes and 216 page lines according to some examples of the present disclosure (page lines 24-203 not shown for clarity). FIG. 8 is an extension of the chart of FIG. 7 showing page lines 204-215. In some examples TLC NAND array 700 may be on a single die with four planes. As shown in FIG. 7, page lines of a NAND are represented by rows and planes of the NAND are represented by columns. Data items (denoted $P_n$) that are to be programmed are divided into portions, a first $P_n$, a second $P_n$, a third $P_n$, and a fourth $P_n$ where n denotes different data items. For example, a first data item received by a host may be partitioned into portions: first $P_1$, second $P_1$, third $P_1$, and fourth $P_1$. A data item may be a page, a word, a block, or any other unit of data sent by a host.

Example portions may include a lower page, an upper page, and an extra page that correspond to the TLC programming pages for the data item. In some examples, for pages 0-3, the first $P_n$ may be a lower page, the second $P_n$ may be an extra page, and the third $P_n$ may be an upper page corresponding to the programming sequences of a TLC memory. In the case of TLC NAND, the fourth $P_n$ may be a copy of the first $P_n$—that is the fourth $P_n$ may be written with the same data as what was written in the first $P_n$. For QLC NAND the fourth $P_n$ may be the fourth programming page. As shown in FIG. 7, in one example improved NAND data placement schema, the portions are striped diagonally such that each portion of a particular data item $P_x$ is on a different plane and a different page from the other portions. In some examples, each portion of a data item $P_x$ may be placed in a page line and on a plane one greater than the previous portion. Thus, the first portion may be placed at a position of (Page Line X, Plane Y), the second portion may be placed at a position of (Page Line X+1, Plane Y+1), the third portion may be placed at a position of (Page Line X+2, Plane Y+2), and the fourth portion may be placed at a position of (Page Line X+3, Plane Y+3). It will be appreciated that "first," "second," "third," and "fourth" portions are merely convenient descriptors for different portions of the data.

When placing the portions, the plane may wrap around to the first plane. For example, as shown in FIG. 7, a first portion of $P_3$ is placed in plane 2 (page 0), the second portion may be placed in plane 3 (page 1), and the third portion may wraparound and be placed in plane 0 (page 2), and the fourth portion may be placed in plane 1 (page 3). This data placement scheme ensures that that error conditions shown in FIG. 5 and FIG. 6 can only affect at most a single portion of a data item $P_n$. As shown, a portion may be repeated, such as a first portion (e.g., at 725).

In some examples, data is written to the NAND in groups of four data items $P_1$-$P_4$ across four page lines (page lines 0-3) and four plane lines (planes 0-3). As can be appreciated, each page line (represented as a row in FIGS. 7 and 8) may store a same portion of different data items (e.g., first portions of data items $P_1$, $P_2$, $P_3$, $P_4$ is written in page 0 in plane 0, plane 1, plane 2, and plane 3 respectively). As can be appreciated, each plane may store a different portion of different data items—that is, each plane stores a first portion, a second portion, a third portion, and a fourth portion, but each portion belongs to a different $P_x$. For each successive next page line, a different portion of the data items are written and the data item is shifted to the right by one (with a wraparound) to prevent a second portion of a same data item from being written to a same plane—thus page line 1 may store the second portions of data items $P_1$, $P_2$, $P_3$, and $P_4$, but written to a plane that is one over from the page above—thus, plane 1, plane 2, plane 3, and plane 0 respectively.

In some examples, the first portion for a first group of four data items (e.g., First $P_1$, First $P_2$, First $P_3$, First $P_4$) may correspond to a lower page of an SLC NAND, the second portion (Second $P_1$, Second $P_2$, Second $P_3$, Second $P_4$) may correspond to an extra page, the third portion (Third $P_1$, Third $P_2$, Third $P_3$, Third $P_4$) may correspond to an upper page, and the fourth portion (Fourth $P_1$, Fourth $P_2$, Fourth $P_3$, Fourth $P_4$) may correspond (in a TLC NAND) to a copy of the first portion (the lower page).

In some examples, the mapping between pages and portions as shown in the figure may be the same for all groups of data items. A group is represented in FIG. 7 by the dotted box and in FIG. 7 comprises a group of four data items. For example, for group 2 (page lines 4-7), the first portion may be the lower page, the second portion may be the upper page, the third portion may be an extra page, and the fourth portion may be a copy of the lower page. As can be appreciated, larger or smaller group sizes may be utilized. Thus a group may comprise 8 data items $P_1$-$P_8$ and may span eight planes and eight pages.

In other examples, instead of the first portion storing a lower page, the second portion storing the extra page, the third portion storing the upper page, and the fourth portion storing a copy of the first portion for all groups—the portion stored may shift for each group. For example, for group 2 (page lines 4-7), the mappings between the portions and the pages may change such that the first portion may store the extra page, the second portion may store an upper page, the third portion may store a lower page, and the fourth portion may be a copy of the first portion (the extra page). For group 3 (pages 8-11), the mapping between the portions and the pages may shift again—thus the first portion may be an upper page, the second portion may be a lower page, the third portion may be an extra page, and the fourth portion may be the same as the first portion (the upper page). For group 4 (pages 12-15), the programming page assigned to the various portions may shift again to be the same as that in pages 0-3, and so on. Thus, the cycle is:

| Page line | Plane (0 . . . 3) |
| --- | --- |
| 0 | Lower |
| 1 | Extra |
| 2 | Upper |
| 3 | Lower |
| 4 | Extra |
| 5 | Upper |
| 6 | Lower |
| 7 | Extra |
| 8 | Upper |
| 9 | Lower |
| 10 | Extra |
| 11 | Upper |
| . . . | . . . |

In addition to the diagonal portion placement scheme, a parity page may be calculated from the data item portions. For example, the parity page may be an XOR of the data in the first portion, second portion, third portions, and fourth portions. For example:

Parity$_n$=First Portion $P_n \oplus$ Second Portion $P_n \oplus$ Third Portion $P_n \oplus$ Fourth Portion $P_n$ where $\oplus$ is an XOR operator.

The parity values may be calculated and temporarily stored in volatile memory (e.g., RAM) and then stored periodically in non-volatile storage in a separate NAND block from the user data. The diagonal placement of the portions of the page data ensures that if a defect in programming or an asynchronous power loss wipes out a whole page, or a whole plane, that the rest of the data is recoverable as at most, only one portion of the data item will be lost, and due to the XOR parity data, it is thus recoverable.

FIG. 9 illustrates a logical placement of the parity pages in a volatile memory of the controller or other component of the NAND according to some examples of the present disclosure. The parity pages shown in FIG. 9 are parity pages that are calculated for the $P_n$ data items in FIGS. 7 and 8. As the data items are programmed to the NAND in FIG. 7, the parity can be calculated and stored in volatile memory (e.g., Random Access Memory). At a first time, T0, the portions of data items $P_1$-$P_{12}$ can be written to page lines 0-11 and plane 0-3 of die 700. At the same time, the parity values of these data items: 902-924 can be calculated and stored in volatile storage such as RAM, as shown in FIG. 9.

At time T1, the portions of data items $P_{13}$-$P_{24}$ are written to page lines 12-23 and the corresponding parities are calculated in stored in RAM, as shown in FIG. 9. In some examples, the parity values 902-924 are overwritten with the parity values 926-948. In some examples, the parity values 902-924 may be written to NAND before they are overwritten, for example, to a reliable SLC block. Similarly, at time T2 parity values for pages 25-36 can be calculated and stored as those pages are written.

FIG. 10 shows a schematic of a parity page storage 1000 used to store the parity pages in nonvolatile NAND. In the example of FIG. 10, the parity page storage 1000 may be configured as SLC blocks for increased reliability. The parity page storage 1000 as shown in FIG. 10 may be in a separate location from the location that stores the user data (e.g., TLC NAND array 700 from FIG. 7) from which the parity pages are generated. In other examples, the parity pages may be stored on a same die as the user data from which the parity pages are generated. Parity pages 1-12 are stored at time T0. Flushed page line count (FPC) indicates the number of page lines of programmed user data (e.g., on die 700). Parity pages 13-24 are stored at time T1, and so on until parity pages 205-216 are stored at time T17.

The parity data stored in RAM or in the SLC 1000 may be used to recover a page of user data. Turning back to FIG. 7, if plane 1 is corrupted (as shown in FIG. 5), only a single portion of the $P_n$ data items may be corrupted by virtue of the failure on plane 1. The system may utilize the parity data to recover these portions. An individual portion of the user data may be recoverable by applying an XOR operation on the remaining pages and the parity page. For example, if Plane 1 is corrupted, the second portion of the $P_1$ data item 715 may be corrupted. This portion may be recovered by XOR-ing the first portion of $P_1$ 710, third portion $P_1$ 720, fourth portion $P_1$, and the parity $P_1$ 902. Similarly, if a page line is corrupted as shown in FIG. 6, only a single portion of the user data page may be lost. For example, if any one of page lines 0-3 of FIG. 7 are corrupted, only a single portion of a particular user page may be lost. For example, if the pages on page line 1 are corrupted, then the second portion of $P_1$ 715 is corrupted, but the first, second, and fourth portions are not and as a result, the third portion may be reconstructed using the parity value. For example, by:

Second Portion $P_1$=First Portion $P_1 \oplus$ Third Portion $P_1 \oplus$ Fourth Portion $P_1 \oplus$ Parity $P_1$ Thus, both horizontal corruption across planes on a same page line and vertical corruption affecting all page lines of a plane can be recoverable as a result of the positional rotation of the portions of the user data.

Figure 11:
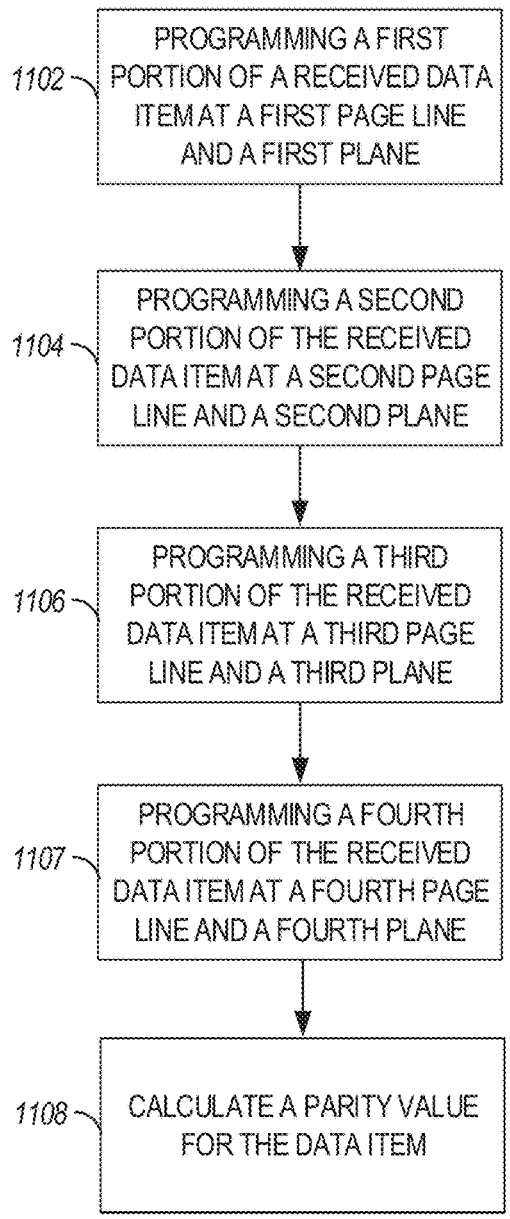
FIG. 11 illustrates a flowchart of a method 1100 of applying an improved NAND data placement schema to storing data on a NAND die of a NAND device according to some examples of the present disclosure.

FIG. 11 shows a flowchart of a method 1100 of applying an improved NAND data placement schema to storing data on a NAND die of a NAND device according to some examples of the present disclosure. A host device may send a data item to write to the NAND. This data item may be programmed to the NAND in a number of portions—a first portion, second portion, third portion, and fourth portion. Example portions may correspond to an upper page, lower page, and extra page of a TLC NAND. In other examples, the data item may be portioned into only two portions (corresponding to a lower page and upper page of an MLC NAND), or four portions (corresponding to a lower page, upper page, middle page, and extra page for a QLC NAND). In other examples, the portions may not correspond to the programming phases of the NAND, but may be divided in other ways (e.g., the most significant bits, least significant bits, and the like). In some examples, the programming page of the NAND that corresponds to the portion may shift based upon a grouping of data items. Thus, in a first grouping of data items, the lower page is written on the first page line of the group and on a later grouping of data items, the extra page may be written on the first page line of the group and so on.

At operation 1102 the controller may program a first portion of the received data into the NAND array at a first page line and a first plane. At operation 1104 the controller may program a second portion of the received data into the NAND array at a second page line and a second plane. At operation 1106 the controller may program a third portion of the received data into the NAND array at a third page line and a third plane. At operation 1107 the controller may program a fourth portion of the received data into the NAND array at a fourth page line and a fourth plane. In some examples, the fourth portion is a copy of one of the first, second, third, or fourth portions. For example, the fourth portion may be a copy of the portion written first (e.g., a first portion) for the group. The first page line, second page line, third page line, fourth page line, first plane, second plane, third plane, and fourth plane may be selected such that the first portion, second portion, third portion, and fourth portions of a particular data item are programmed into memory cells that are on different page lines and are on different planes with respect to each other. In some examples, all the locations are on the same die. At operation 1108, the NAND memory device may calculate a parity value for the data item using the first, second, and third portions. This parity value may be stored in volatile, or non-volatile memory.

While the above data placement schema minimizes data loss by strategic placement of data and the use of parity values, the parity values may be discarded upon completion of the NAND block programming for the data to which the parity corresponds. While this saves the overhead of storing the parity data, this parity data may be leveraged along with the same data placement schema to recover from an Uncorrectable Error Correction Code (UECC) situation in which the NAND cannot recover the data with traditional ECC. For example, as shown in FIG. 12, plane 1, page lines Z to Z+5 may suffer from an unrecoverable ECC error.

By storing the data in the improved NAND data placement schema above, losing a single portion of the data is recoverable with the parity value. This may be costly in terms of additional overhead for storing the parity values. Disclosed in some examples, are methods, systems, memory devices, and machine-readable mediums for clustered parity storage for NAND devices utilizing the above disclosed improved data placement schemas. Rather than storing each parity value, parity values from multiple data items may be combined using an XOR operation and stored in a compressed form to reduce the overprovisioning utilized to save the parity values. A compressed parity value may be a consolidation of multiple parity values, for example, an XOR combination of two or more parity values.

For example, FIG. 13 shows an SLC NAND block 1300 storing a plurality of parity values that are arranged in a plurality of clusters. In FIG. 13, they are arranged in 16 clusters of 54 page lines of four planes for each cluster. Each cluster thus contains 216 parity values. Each parity value corresponds to a data item (e.g., from FIG. 10). A first compressed parity value may be created by XORing parity values in a same position from each different cluster. For example, a compressed parity value may be created from an XOR of the parity value 1, parity value 217, and so on until parity value 3241. This is represented by the dark line in FIG. 13. A second compressed parity value may be created by XORing the second parity value in each cluster. For example, parity 2, parity 218, and so on until parity value 3242. Clusters 2-14 are not shown for compactness and clarity but are included in the XOR calculations.

More generally, a set of compressed parity values may be created. Each parity value in each cluster may be referred to by using a relative position in the cluster using a notation: (cluster, page, plane). For example, parity value 1 in FIG. 13 may be (0, 0, 0) which indicates this parity value is in cluster 0, page 0, and plane 0. The page values may be relative to the cluster i.e., parity 3241 may be addressed by (15, 0, 0) as it is in the first page and the first plane of cluster 15 even though it is in page line 810 overall. The compressed parity values may be calculated by XORing the parity values of same relative positions of all clusters. For example:

Compressed Parity$(X,Y)$=$(0,X,Y)\oplus(1,X,Y)\oplus(2,X,Y)\oplus(3,X,Y)\oplus(4,X,Y)\oplus(5,X,Y)\oplus(6,X,Y)\oplus(7,X,Y)\oplus(8,X,Y)\oplus(9,X,Y)\oplus(10,X,Y)\oplus(11,X,Y)\oplus(12,X,Y)\oplus(13,X,Y)\oplus(14,X,Y)\oplus(15,X,Y)$ As shown in FIG. 13, values of X is of a range 0-53 and Y is a range of 0-3.

As shown in FIG. 14, these compressed parity values may be stored in the NAND and may be denoted PARITYX$_a$. In some examples, the compressed parity and/or the uncompressed parity values may be stored in the original NAND block before the original block is closed. The uncompressed values may then be deleted and the space freed up for other values (e.g., the compressed parity values). The group of data items P$_n$ that were used to calculate the parity values that were used to calculate a compressed parity value may be called a compressed parity data item group G$_n$. For example, if FIG. 13 shows parity values that correspond to data items P$_n$ from FIG. 7, all portions of data items that were used to produce the constituent parity values (e.g., parity 1, parity 217, and so on until parity 3241) for a first compressed parity value may be part of compressed parity data item group G$_1$. For parity value 1, the portions of the data items may include first P$_1$, second P$_1$, third P$_1$, and fourth P$_1$ from FIG. 7.

Should an uncorrectable ECC error happen, such as shown in FIG. 12, the NAND device may utilize the compressed parity value to recreate the portion of the data item lost. By XORing the compressed parity value and the values of the data item portions in the group G$_n$ (excluding of course the corrupted portion), the corrupted portion of the data item may be recovered. For example, in the case of a first portion of data item P$_1$ from (FIG. 7) being unrecoverable, the system may XOR the compressed parity value PARITYX1, and the data portions in the group G$_1$ (including the second, third, and fourth portions of data item P$_1$) with the exception of the first portion of data item P$_1$ to recover the data item P$_1$.

Figure 15:
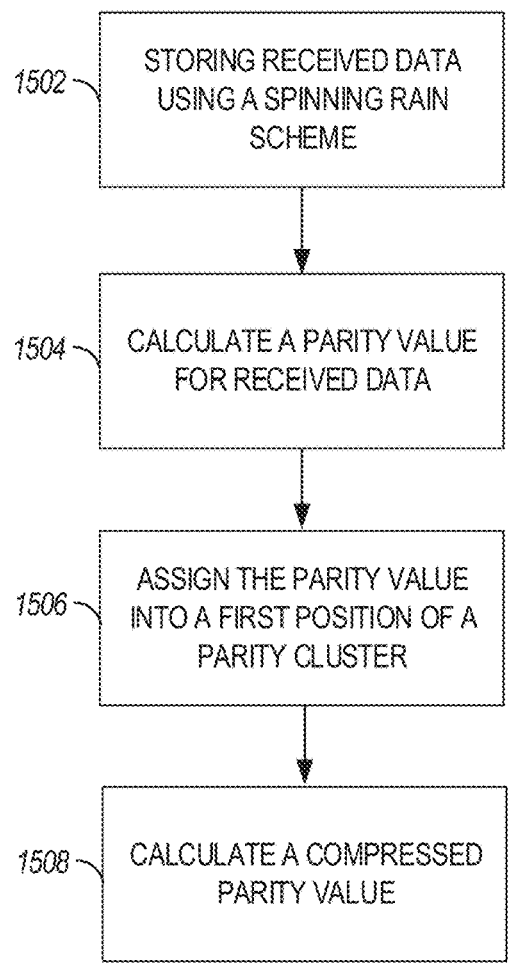
FIG. 15 illustrates a flow chart of a method of clustering parity values in an improved NAND data placement schema of a NAND device according to some examples of the present disclosure.

FIG. 15 illustrates a flow chart of a method of clustering parity values according to some examples of the present disclosure. At operation 1502, incoming data may be stored according to the disclosed improved NAND data placement schema. For example, storing a received data item in memory cells of the NAND array such that a first portion, second portion, third portion, and fourth portion of the data item are stored in memory cells in the array that are on different page lines and different planes with respect to each other as illustrated in FIG. 7. At operation 1504, a parity value may be calculated for a received data item and stored in volatile or non-volatile storage. As noted, the parity value may be the XOR of the portions of the data item. At operation 1506, the NAND device may assign the parity value calculated at operation 1504 into a position of a parity cluster. For example, a first position of the parity cluster. At operation 1508, using a same position of each of the clusters, a compressed parity value may be calculated. For example, by applying an XOR operator to the parity value in a same position in each cluster of parity values.

This compressed parity value may be utilized to recover a data portion as previously described. For example, by XORing the data portions in the compressed parity data item group (with the exception of the data portion that was corrupted) and the compressed parity, the data portion that was corrupted may be recovered.

For example if we have the following data items P$_n$ belonging to the first parity value (e.g., first page line and the first plane) in each parity value cluster:

| P$_n$ | First portion | Second portion | Third portion | Fourth Portion | Parity$_n$ |
|---|---|---|---|---|---|
| 1 | 010 | 111 | 000 | 010 | 111 |
| 54 | 101 | 001 | 110 | 101 | 111 |
| 810 | 000 | 110 | 010 | 000 | 100 |

Then the compressed parity for the group of P$_n$ data items in the table (G$_1$) is the XOR of 111, 111, and 100 which is 100. To recover a lost portion of data, say the second portion of P$_{54}$ the system calculates the XOR of 010, 111, 000, 010, 101, 110, 101, 000, 110, 010, 000 and 100 (which is the compressed parity). This results in: 001 which is the correct value. Note that the example table and example above is simplified by having only three P values (1, 54, and 810) and leaving out values for P$_{108}$ that would be in group G$_1$ as shown in FIG. 13.

Figure 16:
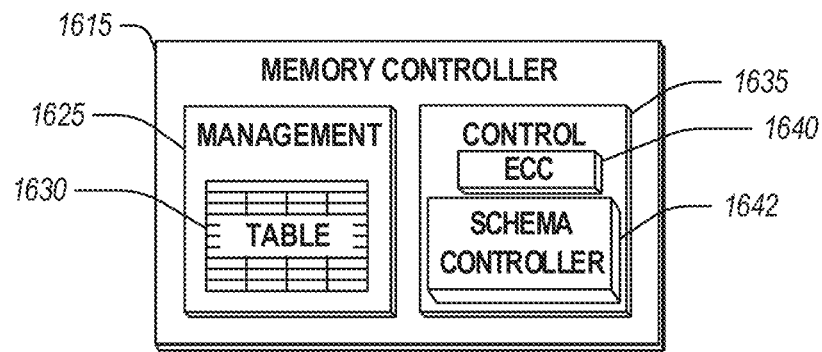
FIG. 16 illustrates a schematic of a memory controller according to some examples of the present disclosure.

FIG. 16 illustrates a schematic of a memory controller 1615 according to some examples of the present disclosure. Memory controller 1615 is an example of memory controller 115, memory manager 1625 is an example of memory manager 125, management tables 1630 may be an example of management table 130. Controller 1635 and ECC 1640 may be an example of controller 135 and ECC 140 of FIG. 1. Controller 1635 includes a schema controller 1642 that may determine where to store portions of data items. In some examples, the positioning is in accordance with the NAND data placement schema disclosed herein. For example, placing a first portion of a received data item into the array at a first page line of a plurality of page lines of a NAND and at a first plane of a plurality of planes; programming a second portion of the received data item into the array at a second page line of the plurality of page lines and at a second plane of the plurality of planes; programming a third portion of the received data item into the array at a third page line of the plurality of page lines and at a third plane of the plurality of planes; calculating a parity value for the data item using the first portion, second portion, and third portion; and wherein the first page line, second page line, third page line, first plane, second plane, and third plane are selected such that the first portion, second portion and third portion are stored in memory cells that are on different page lines and different planes with respect to each other. For example, schema controller 1642 may position data in the NAND as shown in FIGS. 7 and 8.

In some examples, the schema controller 1642 may also calculate one or more parity values. In some examples, the parity values may be calculated by a hardware XOR processor.

The schema controller 1642 may allocate and assign parity values to volatile memory locations (as shown in FIG. 9), non-volatile memory locations (as shown in FIG. 10) and the like. Schema controller 1642 may assign the parity values to clusters and utilize a parity value from each cluster to create a compressed parity value and that compressed parity value may be stored. The parity value utilized from each cluster may be selected based upon a formula or other schema. For example, each parity value may be assigned a relative position in each cluster (e.g., a first parity value in a cluster, a second parity value, and so on) and a same position in each cluster may be utilized to create the compressed parity value. The schema controller 1642 may store the compressed parity values in volatile or non-volatile memory (e.g., as shown in FIG. 14). Schema controller 1642 may implement the methods of FIG. 11 and FIG. 15.

Figure 17:
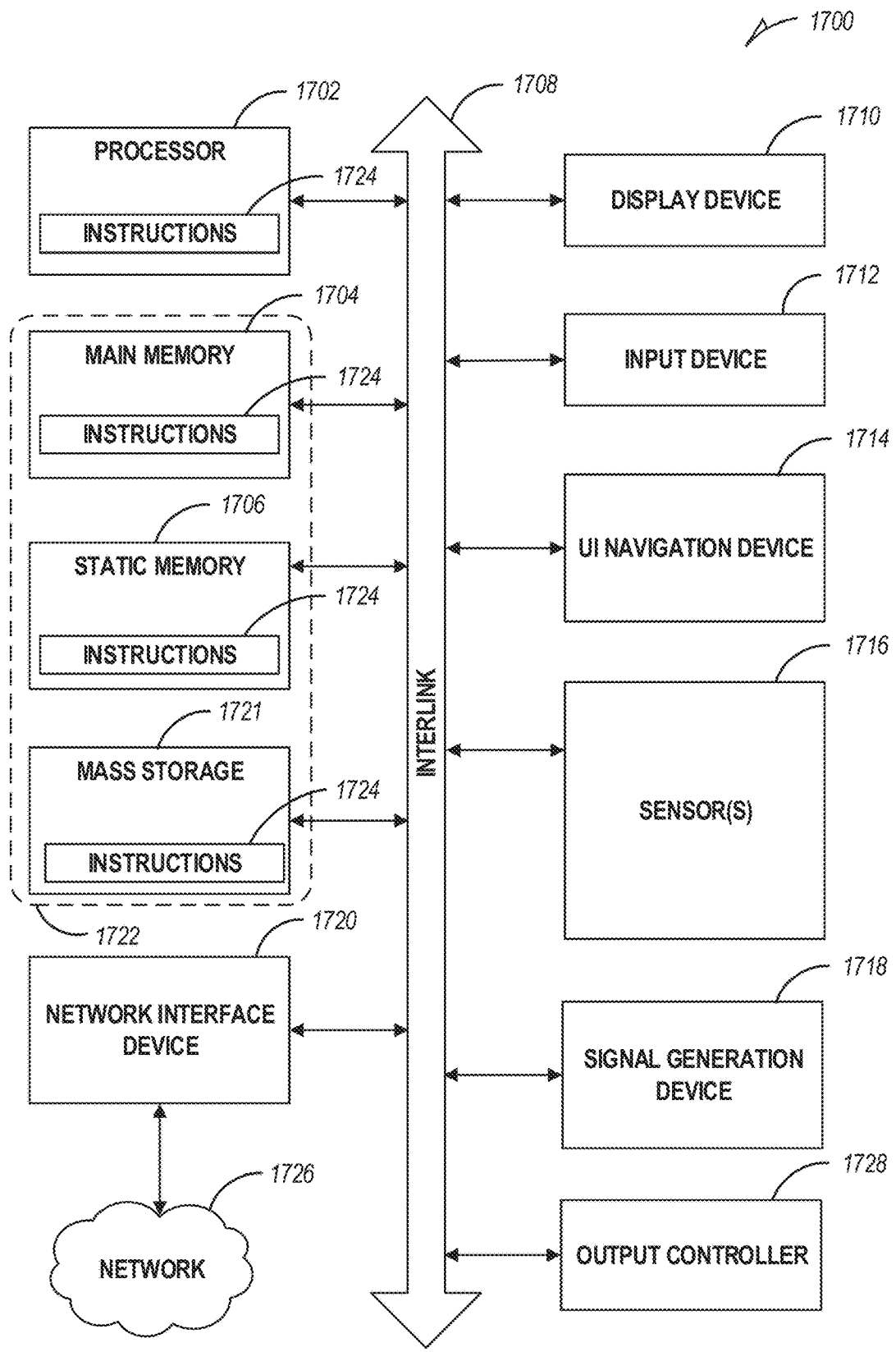
FIG. 17 is a block diagram illustrating an example of a machine upon which one or more embodiments may be implemented.

FIG. 17 illustrates a block diagram of an example machine 1700 upon which any one or more of the techniques (e.g., methodologies) discussed herein may perform. In alternative embodiments, the machine 1700 may operate as a standalone device or may be connected (e.g., networked) to other machines. In a networked deployment, the machine 1700 may operate in the capacity of a server machine, a client machine, or both in server-client network environments. In an example, the machine 1700 may act as a peer machine in peer-to-peer (P2P) (or other distributed) network environment. The machine 1700 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 1700 (e.g., the host device 105, the memory device 110, etc.) may include a hardware processor 1702 (e.g., a central processing unit (CPU), a graphics processing unit (GPU), a hardware processor core, or any combination thereof, such as the memory controller 115, etc.), a main memory 1704 and a static memory 1706, some or all of which may communicate with each other via an interlink (e.g., bus) 1708. The machine 1700 may further include a display unit 1710, an alphanumeric input device 1712 (e.g., a keyboard), and a user interface (UI) navigation device 1714 (e.g., a mouse). In an example, the display unit 1710, input device 1712 and UI navigation device 1714 may be a touch screen display. The machine 1700 may additionally include a storage device (e.g., drive unit) 1716, a signal generation device 1718 (e.g., a speaker), a network interface device 1720, and one or more sensors 1716, such as a global positioning system (GPS) sensor, compass, accelerometer, or other sensor. The machine 1700 may include an output controller 1728, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 1716 may include a machine readable medium 1722 on which is stored one or more sets of data structures or instructions 1724 (e.g., software) embodying or utilized by any one or more of the techniques or functions described herein. The instructions 1724 may also reside, completely or at least partially, within the main memory 1704, within static memory 1706, or within the hardware processor 1702 during execution thereof by the machine 1700. In an example, one or any combination of the hardware processor 1702, the main memory 1704, the static memory 1706, or the storage device 1716 may constitute the machine readable medium 1722.

While the machine readable medium 1722 is illustrated as a single medium, the term "machine readable medium" may include a single medium or multiple media (e.g., a centralized or distributed database, and/or associated caches and servers) configured to store the one or more instructions 1724.

The term "machine readable medium" may include any medium capable of storing, encoding, or carrying instructions for execution by the machine 1700 and that cause the machine 1700 to perform any one or more of the techniques of the present disclosure, or capable of storing, encoding or carrying data structures used by or associated with such instructions. Non-limiting machine readable medium examples may include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 1724 (e.g., software, programs, an operating system (OS), etc.) or other data are stored on the storage device 1721, can be accessed by the memory 1704 for use by the processor 1702. The memory 1704 (e.g., DRAM) is typically fast, but volatile, and thus a different type of storage than the storage device 1721 (e.g., an SSD), which is suitable for long-term storage, including while in an "off" condition. The instructions 1724 or data in use by a user or the machine 1700 are typically loaded in the memory 1704 for use by the processor 1702. When the memory 1704 is full, virtual space from the storage device 1721 can be allocated to supplement the memory 1704; however, because the storage 1721 device is typically slower than the memory 1704, and write speeds are typically at least twice as slow as read speeds, use of virtual memory can greatly reduce user experience due to storage device latency (in contrast to the memory 1704, e.g., DRAM). Further, use of the storage device 1721 for virtual memory can greatly reduce the usable lifespan of the storage device 1721.

In contrast to virtual memory, virtual memory compression (e.g., the Linux® kernel feature "ZRAM") uses part of the memory as compressed block storage to avoid paging to the storage device 1721. Paging takes place in the compressed block until it is necessary to write such data to the storage device 1721. Virtual memory compression increases the usable size of memory 1704, while reducing wear on the storage device 1721.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 1724 may further be transmitted or received over a communications network 1726 using a transmission medium via the network interface device 1720 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 1720 may include one or more physical jacks (e.g., Ethernet, coaxial, or phone jacks) or one or more antennas to connect to the communications network 1726. In an example, the network interface device 1720 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium capable of storing, encoding or carrying instructions for execution by the machine 1700, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, i.e., a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but may instead be generally perpendicular to the surface of the substrate, and may form an acute angle with the surface of the substrate (e.g., between 60 and 120 degrees, etc.).

In some embodiments described herein, different doping configurations may be applied to a source-side select gate (SGS), a control gate (CG), and a drain-side select gate (SGD), each of which, in this example, may be formed of or at least include polysilicon, with the result such that these tiers (e.g., polysilicon, etc.) may have different etch rates when exposed to an etching solution. For example, in a process of forming a monolithic pillar in a 3D semiconductor device, the SGS and the CG may form recesses, while the SGD may remain less recessed or even not recessed. These doping configurations may thus enable selective etching into the distinct tiers (e.g., SGS, CG, and SGD) in the 3D semiconductor device by using an etching solution (e.g., tetramethylammonium hydroxide (TMCH)).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

OTHER NOTES AND EXAMPLES

Example 1 is a NAND memory device comprising: an array of NAND memory cells organized into multiple planes and addressable by multiple page lines; and a controller configured to perform operations comprising: programming a first portion of a received data item into the array at a first page line of the multiple page lines and at a first plane of the multiple planes; programming a second portion of the received data item into the array at a second page line of the multiple page lines and at a second plane of the multiple planes; programming a third portion of the received data item into the array at a third page line of the multiple page lines and at a third plane of the multiple planes.

In Example 2, the subject matter of Example 1, wherein the operations comprise storing a parity value by applying an XOR operator to the first portion, second portion, and third portion.

In Example 3, the subject matter of Example 2, wherein the operations further comprise storing the parity value in the array of NAND memory cells.

In Example 4, the subject matter of Example 3, wherein the parity value is stored in a location of the array of NAND memory cells that are configured as Single Level Cell (SLC) memory cells.

In Example 5, the subject matter of any of Examples 3-4, wherein the first portion, second portion, and third portion are programmed into a location of the array of NAND memory cells that are configured as Triple Level Cell (TLC) memory cells.

In Example 6, the subject matter of any of Examples 2-5, wherein the operations comprise: determining that one of the first portion, second portion, or third portion was corrupted; and recovering the one of the first portion, second portion, or third portion by utilizing the parity value.

In Example 7, the subject matter of any of Examples 2-6 includes, a volatile memory in communication with the controller; and wherein the operations further comprise: initially storing the parity value in the volatile memory; and moving the parity value to the array of NAND memory cells.

In Example 8, the subject matter of any of Examples 1-7, wherein the operations further comprise: programming a fourth portion of the received data item into the array at a fourth page line of the multiple page lines and at a fourth plane of the multiple planes.

In Example 9, the subject matter of any of Examples 1-8, wherein the first portion, the second portion and the third portion comprise individual bits within the received data.

In Example 10, the subject matter of any of Examples 1-9, wherein the third page line and third plane are greater than the second page line and second plane, and the second page line and second plane are greater than the first page line and first plane.

Example 11 is a method of storing data on a NAND device that includes, an array of NAND memory cells organized into multiple planes and addressable by multiple page lines, the method comprising: programming a first portion of a received data item into the array at a first page line of the multiple page lines and at a first plane of the multiple planes; programming a second portion of the received data item into the array at a second page line of the multiple page lines and at a second plane of the multiple planes; programming a third portion of the received data item into the array at a third page line of the multiple page lines and at a third plane of the multiple planes.

In Example 12, the subject matter of Example 11 includes, storing a parity value by applying an XOR operator to the first portion, second portion, and third portion.

In Example 13, the subject matter of Example 12 includes, storing the parity value in the array of NAND memory cells.

In Example 14, the subject matter of Example 13, wherein the parity value is stored in a location of the array of NAND memory cells that are configured as Single Level Cell (SLC) memory cells.

In Example 15, the subject matter of any of Examples 13-14, wherein the first portion, second portion, and third portion are programmed into a location of the array of NAND memory cells that are configured as Triple Level Cell (TLC) memory cells.

In Example 16, the subject matter of any of Examples 12-15 includes, determining that one of the first portion, second portion, or third portion was corrupted; and recovering the one of the first portion, second portion, or third portion by utilizing the parity value.

In Example 17, the subject matter of any of Examples 12-16 includes, initially storing the parity value in a volatile memory; and moving the parity value to the array of NAND memory cells.

In Example 18, the subject matter of any of Examples 11-17 includes, programming a fourth portion of the received data item into the array at a fourth page line of the multiple page lines and at a fourth plane of the multiple planes.

In Example 19, the subject matter of any of Examples 11-18, wherein the first portion, the second portion and the third portion comprise individual bits within the received data.

In Example 20, the subject matter of any of Examples 11-19, wherein the third page line and third plane are greater than the second page line and second plane, and the second page line and second plane are greater than the first page line and first plane.

Example 21 is a machine-readable medium, comprising instructions, which when executed by a machine, cause the machine to perform operations comprising: programming a first portion of a received data item into a NAND array at a first page line of multiple page lines and at a first plane of multiple planes of the NAND array; programming a second portion of the received data item into the array at a second page line of the multiple page lines and at a second plane of the multiple planes; programming a third portion of the received data item into the array at a third page line of the multiple page lines and at a third plane of the multiple planes.

In Example 22, the subject matter of Example 21, wherein the operations comprise storing a parity value by applying an XOR operator to the first portion, second portion, and third portion.

In Example 23, the subject matter of Example 22, wherein the operations further comprise storing the parity value in the array of NAND memory cells.

In Example 24, the subject matter of Example 23, wherein the parity value is stored in a location of the array of NAND memory cells that are configured as Single Level Cell (SLC) memory cells.

In Example 25, the subject matter of any of Examples 23-24, wherein the first portion, second portion, and third portion are programmed into a location of the array of NAND memory cells that are configured as Triple Level Cell (TLC) memory cells.

In Example 26, the subject matter of any of Examples 22-25, wherein the operations comprise: determining that one of the first portion, second portion, or third portion was corrupted; and recovering the one of the first portion, second portion, or third portion by utilizing the parity value.

In Example 27, the subject matter of any of Examples 22-26 includes, a volatile memory in communication with the controller; and wherein the operations further comprise: initially storing the parity value in the volatile memory; and moving the parity value to the array of NAND memory cells.

In Example 28, the subject matter of any of Examples 21-27, wherein the operations further comprise: programming a fourth portion of the received data item into the array at a fourth page line of the multiple page lines and at a fourth plane of the multiple planes.

In Example 29, the subject matter of any of Examples 21-28, wherein the first portion, the second portion and the third portion comprise individual bits within the received data.

In Example 30, the subject matter of any of Examples 21-29, wherein the third page line and third plane are greater than the second page line and second plane, and the second page line and second plane are greater than the first page line and first plane.

Example 31 is a NAND memory device comprising: an array of NAND memory cells organized into multiple planes and addressable by multiple page lines; and a controller configured to perform operations comprising: means for programming a first portion of a received data item into the array at a first page line of the multiple page lines and at a first plane of the multiple planes; means for programming a second portion of the received data item into the array at a second page line of the multiple page lines and at a second plane of the multiple planes; means for programming a third portion of the received data item into the array at a third page line of the multiple page lines and at a third plane of the multiple planes.

In Example 32, the subject matter of Example 31 includes, means for storing a parity value by applying an XOR operator to the first portion, second portion, and third portion.

In Example 33, the subject matter of Example 32 includes, means for storing the parity value in the array of NAND memory cells.

In Example 34, the subject matter of Example 33, wherein the parity value is stored in a location of the array of NAND memory cells that are configured as Single Level Cell (SLC) memory cells.

In Example 35, the subject matter of any of Examples 33-34, wherein the first portion, second portion, and third portion are programmed into a location of the array of NAND memory cells that are configured as Triple Level Cell (TLC) memory cells.

In Example 36, the subject matter of any of Examples 32-35 includes, means for determining that one of the first portion, second portion, or third portion was corrupted; and means for recovering the one of the first portion, second portion, or third portion by utilizing the parity value.

In Example 37, the subject matter of any of Examples 32-36 includes, means for initially storing the parity value in a volatile memory; and means for moving the parity value to the array of NAND memory cells.

In Example 38, the subject matter of any of Examples 31-37 includes, means for programming a fourth portion of the received data item into the array at a fourth page line of the multiple page lines and at a fourth plane of the multiple planes.

In Example 39, the subject matter of any of Examples 31-38, wherein the first portion, the second portion and the third portion comprise individual bits within the received data.

In Example 40, the subject matter of any of Examples 31-39, wherein the third page line and third plane are greater than the second page line and second plane, and the second page line and second plane are greater than the first page line and first plane.

Example 41 is a NAND memory device comprising: an array of NAND memory cells organized into multiple planes and addressable by multiple page lines; and a controller configured to perform operations comprising: storing a received data item in memory cells of the NAND array such that a first portion, second portion and third portion of the data item are stored in memory cells in the array such that are on different page lines and different planes with respect to each other; calculating a parity value for the received data item using the first portion, second portion, and third portion; assigning the parity value for the received data item into a first position of a parity cluster of multiple parity clusters; and calculating a compressed parity value based upon the parity value and a second parity value of a second parity cluster of the multiple parity clusters.

In Example 42, the subject matter of Example 41, wherein the operations of calculating the compressed parity value based upon the parity value and the second parity value of the second parity cluster comprises selecting the second parity value from the second parity cluster based upon a relative position of the second parity value in the second parity cluster matching the relative position of the parity value in the first parity cluster.

In Example 43, the subject matter of any of Examples 41-42, wherein the parity value is stored in a block of the NAND memory cells.

In Example 44, the subject matter of any of Examples 42-43, wherein the operations comprise storing the compressed parity value in a block of the NAND memory cells.

In Example 45, the subject matter of any of Examples 43-44, wherein the operations comprise overwriting the parity value with the compressed parity values.

In Example 46, the subject matter of any of Examples 41-45, wherein the operations comprise: calculating the second parity value based upon first, second, and third portions of a second data item; receiving an indication that a first portion of the data item read from the array of NAND memory cells failed an Error Correction Code check; recovering the first portion using the compressed parity value, the second and third portions of the data item, and the first, second, and third portions of the second data item.

In Example 47, the subject matter of any of Examples 41-46, wherein the operations of calculating the compressed parity value comprises applying an XOR operation to the parity value and the second parity value.

In Example 48, the subject matter of any of Examples 41-47, wherein the operations of calculating the parity value for the received data item using the first portion, second portion, and third portion comprises applying an XOR operator to the first portion, second portion, and third portion.

Example 49 is a machine-readable medium, comprising instructions, which when executed by a machine, cause the machine to perform operations comprising: storing a received data item in memory cells of a NAND array such that a first portion, second portion and third portion of the data item are stored in memory cells in the array that they are on different page lines and different planes with respect to each other; calculating a parity value for the received data item using the first portion, second portion, and third portion; assigning the parity value for the received data item into a first position of a parity cluster of multiple parity clusters; and calculating a compressed parity value based upon the parity value and a second parity value of a second parity cluster of the multiple parity clusters.

In Example 50, the subject matter of Example 49, wherein the operations of calculating the compressed parity value based upon the parity value and the second parity value of the second parity cluster comprises selecting the second parity value from the second parity cluster based upon a relative position of the second parity value in the second parity cluster matching the relative position of the parity value in the first parity cluster.

In Example 51, the subject matter of any of Examples 49-50, wherein the parity value is stored in a block of the NAND memory cells.

In Example 52, the subject matter of any of Examples 50-51, wherein the operations further comprise storing the compressed parity value in a block of the NAND memory cells.

In Example 53, the subject matter of any of Examples 51-52, wherein the operations further comprise overwriting the parity value with the compressed parity values.

In Example 54, the subject matter of any of Examples 49-53, wherein the operations further comprise: calculating the second parity value based upon first, second, and third portions of a second data item; receiving an indication that a first portion of the data item read from the array of NAND memory cells failed an Error Correction Code check; recovering the first portion using the compressed parity value, the second and third portions of the data item, and the first, second, and third portions of the second data item.

In Example 55, the subject matter of any of Examples 49-54, wherein the operations of calculating the compressed parity value comprises applying an XOR operation to the parity value and the second parity value.

In Example 56, the subject matter of any of Examples 49-55, wherein the operations of calculating the parity value for the received data item using the first portion, second portion, and third portion comprises applying an XOR operator to the first portion, second portion, and third portion.

Example 57 is a method of storing data on a NAND device that includes, an array of NAND memory cells organized into multiple planes and addressable by multiple page lines, the method comprising: storing a received data item in memory cells of a NAND array such that a first portion, second portion and third portion of the data item are stored in memory cells in the array that they are on different page lines and different planes with respect to each other; calculating a parity value for the received data item using the first portion, second portion, and third portion; assigning the parity value for the received data item into a first position of a parity cluster of multiple parity clusters; and calculating a compressed parity value based upon the parity value and a second parity value of a second parity cluster of the multiple parity clusters.

In Example 58, the subject matter of Example 57, wherein calculating the compressed parity value based upon the parity value and the second parity value of the second parity cluster comprises selecting the second parity value from the second parity cluster based upon a relative position of the second parity value in the second parity cluster matching the relative position of the parity value in the first parity cluster.

In Example 59, the subject matter of any of Examples 57-58, wherein the parity value is stored in a block of the NAND memory cells.

In Example 60, the subject matter of any of Examples 58-59 includes, storing the compressed parity value in a block of the NAND memory cells.

In Example 61, the subject matter of any of Examples 59-60 includes, overwriting the parity value with the compressed parity values.

In Example 62, the subject matter of any of Examples 57-61 includes, calculating the second parity value based upon first, second, and third portions of a second data item; receiving an indication that a first portion of the data item read from the array of NAND memory cells failed an Error Correction Code check; recovering the first portion using the compressed parity value, the second and third portions of the data item, and the first, second, and third portions of the second data item.

In Example 63, the subject matter of any of Examples 57-62, wherein calculating the compressed parity value comprises applying an XOR operation to the parity value and the second parity value.

In Example 64, the subject matter of any of Examples 57-63, wherein calculating the parity value for the received data item using the first portion, second portion, and third portion comprises applying an XOR operator to the first portion, second portion, and third portion.

Example 65 is a NAND memory device comprising: an array of NAND memory cells organized into multiple planes and addressable by multiple page lines; and a controller configured to perform operations comprising: means for storing a received data item in memory cells of a NAND array such that a first portion, second portion and third portion of the data item are stored in memory cells in the array that they are on different page lines and different planes with respect to each other; means for calculating a parity value for the received data item using the first portion, second portion, and third portion; means for assigning the parity value for the received data item into a first position of a parity cluster of multiple parity clusters; and means for calculating a compressed parity value based upon the parity value and a second parity value of a second parity cluster of the multiple parity clusters.

In Example 66, the subject matter of Example 65, wherein the means for calculating the compressed parity value based upon the parity value and the second parity value of the second parity cluster comprises means for selecting the second parity value from the second parity cluster based upon a relative position of the second parity value in the second parity cluster matching the relative position of the parity value in the first parity cluster.

In Example 67, the subject matter of any of Examples 65-66, wherein the parity value is stored in a block of the NAND memory cells.

In Example 68, the subject matter of any of Examples 66-67 includes, means for storing the compressed parity value in a block of the NAND memory cells.

In Example 69, the subject matter of any of Examples 67-68 includes, means for overwriting the parity value with the compressed parity values.

In Example 70, the subject matter of any of Examples 65-69 includes, means for calculating the second parity value based upon first, second, and third portions of a second data item; means for receiving an indication that a first portion of the data item read from the array of NAND memory cells failed an Error Correction Code check; and means for recovering the first portion using the compressed parity value, the second and third portions of the data item, and the first, second, and third portions of the second data item.

In Example 71, the subject matter of any of Examples 65-70, wherein the means for calculating the compressed parity value comprises means for applying an XOR operation to the parity value and the second parity value.

In Example 72, the subject matter of any of Examples 65-71, wherein the means for calculating the parity value for the received data item using the first portion, second portion, and third portion comprises means for applying an XOR operator to the first portion, second portion, and third portion.

Example 73 is at least one machine-readable medium including instructions that, when executed by processing circuitry, cause the processing circuitry to perform operations to implement of any of Examples 1-72.

Example 74 is an apparatus comprising means to implement any of Examples 1-72.

Example 75 is a system to implement any of Examples 1-72.

Example 76 is a method to implement any of Examples 1-72.

The invention claimed is:

1. A memory controller device comprising:
a hardware processor configured to perform operations comprising:
receiving a data item from a host over a host interface;
programming a first portion of the received data item into an array of NAND memory cells organized into multiple planes and multiple pages at a first page of the multiple pages and at a first plane of the multiple planes;
programming a second portion of the received data item into the array at a second page of the multiple pages and at a second plane of the multiple planes, the second page being assigned a page line number greater than a page line number of the first page;
programming a third portion of the received data item into the array at a third page of the multiple pages and at a third plane of the multiple planes, the third page being assigned a page line number greater than the page line number of the second page; and
programming a fourth portion of the received data item into the array at a fourth page of the multiple pages and at a fourth plane of the multiple planes, the fourth page being assigned a page line number greater than the page line number assigned to the third page; and
wherein each data portion of the received data item is programmed on a different page line than every other data portion.

2. The memory controller device of claim 1, wherein the first portion, second portion, third portion, and fourth portion each comprise one of a lower page, an upper page, an extra page, or a copy of one of the lower page, upper page, or extra page.

3. The memory controller device of claim 1, wherein the hardware processor is further configured to calculate a parity value for the received data item based on the first portion, the second portion, and the third portion.

4. The memory controller device of claim 3, wherein the hardware processor is further configured to store the parity value in a separate block of single-level cell (SLC) NAND memory cells.

5. The memory controller device of claim 1, wherein the hardware processor is further configured to: assign a parity value calculated for the received data item to a first position of a parity cluster, the parity cluster comprising parity values for multiple received data items; and calculate a compressed parity value by performing an XOR operation on parity values occupying the first position in the parity cluster.

6. The memory controller device of claim 5, wherein the hardware processor is further configured to recover a corrupted portion of the received data item by performing an XOR operation on the compressed parity value and non-corrupted portions of the received data item.

7. The memory controller device of claim 1, wherein the hardware processor is further configured to shift an assignment of which data portion corresponds to a lower page, an upper page, and an extra page for each grouping of multiple received data items.

8. A method comprising:
receiving a data item from a host over a host interface;
programming a first portion of the received data item into an array of NAND memory cells organized into multiple planes and multiple pages at a first page of the multiple pages and at a first plane of the multiple planes;
programming a second portion of the received data item into the array at a second page of the multiple pages and at a second plane of the multiple planes, the second page being assigned a page line number greater than a page line number of the first page;
programming a third portion of the received data item into the array at a third page of the multiple pages and at a third plane of the multiple planes, the third page being assigned a page line number greater than the page line number of the second page; and
programming a fourth portion of the received data item into the array at a fourth page of the multiple pages and at a fourth plane of the multiple planes, the fourth page being assigned a page line number greater than the page line number assigned to the third page; and
wherein each data portion of the received data item is programmed on a different page line than every other data portion.

9. The method of claim 8, wherein the first portion, second portion, third portion, and fourth portion each comprise one of a lower page, an upper page, an extra page, or a copy of one of the lower page, upper page, or extra page.

10. The method of claim 8, further comprising calculating a parity value for the received data item based on the first portion, the second portion, and the third portion.

11. The method of claim 10, further comprising storing the parity value in a separate block of single-level cell (SLC) NAND memory cells.

12. The method of claim 8, further comprising: assigning a parity value calculated for the received data item to a first position of a parity cluster, the parity cluster comprising parity values for multiple received data items; and calculating a compressed parity value by performing an XOR operation on parity values occupying the first position in the parity cluster.

13. The method of claim 12, further comprising recovering a corrupted portion of the received data item by performing an XOR operation on the compressed parity value and non-corrupted portions of the received data item.

14. The method of claim 8, further comprising shifting an assignment of which data portion corresponds to a lower page, an upper page, and an extra page for each grouping of multiple received data items.

15. A machine-readable medium, storing instructions, which when executed by a machine, cause the machine to perform operations comprising:
receiving a data item from a host over a host interface;
programming a first portion of the received data item into an array of NAND memory cells organized into multiple planes and multiple pages at a first page of the multiple pages and at a first plane of the multiple planes;
programming a second portion of the received data item into the array at a second page of the multiple pages and at a second plane of the multiple planes, the second page being assigned a page line number greater than a page line number of the first page;
programming a third portion of the received data item into the array at a third page of the multiple pages and at a third plane of the multiple planes, the third page being assigned a page line number greater than the page line number of the second page; and programming a fourth portion of the received data item into the array at a fourth page of the multiple pages and at a fourth plane of the multiple planes, the fourth page being assigned a page line number greater than the page line number assigned to the third page; and wherein each data portion of the received data item is programmed on a different page line than every other data portion.

16. The machine-readable medium of claim 15, wherein the first portion, second portion, third portion, and fourth portion each comprise one of a lower page, an upper page, an extra page, or a copy of one of the lower page, upper page, or extra page.

17. The machine-readable medium of claim 15, wherein the operations further comprise calculating a parity value for the received data item based on the first portion, the second portion, and the third portion.

18. The machine-readable medium of claim 17, wherein the operations further comprise storing the parity value in a separate block of single-level cell (SLC) NAND memory cells.

19. The machine-readable medium of claim 15, wherein the operations further comprise: assigning a parity value calculated for the received data item to a first position of a parity cluster, the parity cluster comprising parity values for multiple received data items; and calculating a compressed parity value by performing an XOR operation on parity values occupying the first position in the parity cluster.

20. The machine-readable medium of claim 19, wherein the operations further comprise recovering a corrupted portion of the received data item by performing an XOR operation on the compressed parity value and non-corrupted portions of the received data item.

* * * * *